(12) United States Patent
Goto

(10) Patent No.: US 7,442,492 B2
(45) Date of Patent: *Oct. 28, 2008

(54) PLANOGRAPHIC PRINTING PLATE PRECURSOR

(75) Inventor: Takahiro Goto, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/212,615

(22) Filed: Aug. 29, 2005

(65) Prior Publication Data

US 2006/0046192 A1  Mar. 2, 2006

(30) Foreign Application Priority Data

Aug. 27, 2004  (JP) .............................. 2004-248536

(51) Int. Cl.
*G03F 7/00* (2006.01)
*G03F 7/004* (2006.01)

(52) U.S. Cl. ................. 430/302; 430/273.1; 430/281.1; 430/286.1; 430/288.1; 430/309; 430/434; 430/944; 430/945

(58) Field of Classification Search ............. 430/273.1, 430/281.1, 286.1, 288.1, 302, 309, 434, 494, 430/944, 945
See application file for complete search history.

(56) References Cited

U.S. PATENT DOCUMENTS

| 5,885,746 | A | 3/1999 | Iwai | |
| 2005/0069811 | A1* | 3/2005 | Mitsumoto et al. | 430/270.1 |
| 2006/0046185 | A1* | 3/2006 | Goto | 430/270.1 |
| 2006/0046199 | A1* | 3/2006 | Mitsumoto et al. | 430/302 |
| 2006/0068327 | A1* | 3/2006 | Mori et al. | 430/281.1 |

FOREIGN PATENT DOCUMENTS

EP  1 176 467 A1 * 1/2002

(Continued)

OTHER PUBLICATIONS

English language machine translation of JP 2004-212558.*

(Continued)

*Primary Examiner*—Amanda C. Walke
(74) *Attorney, Agent, or Firm*—Sughrue Mion, PLLC

(57) ABSTRACT

The present invention provides a planographic printing plate precursor having a support, a photosensitive layer and a protective layer. The photosensitive layer contains at least an infrared absorbing agent, a polymerization initiating agent, a polymerizable compound and a binder polymer having repeating units represented by the following Formula (i). Further, the protective layer contains at least an inorganic lamellar compound.

Formula (i)

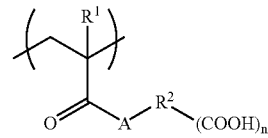

In Formula (i), $R^1$ represents a hydrogen atom or a methyl group; $R^2$ represents a connecting group having two or more types of atom selected from the group consisting of a carbon atom, a hydrogen atom, an oxygen atom, a nitrogen atom, and a sulfur atom and having 2 to 82 atoms in total; A represents an oxygen atom or $-NR^3-$, and $R^3$ represents a hydrogen atom or a monovalent hydrocarbon group having 1 to 10 carbon atoms; and n is an integer of 1 to 5.

13 Claims, 2 Drawing Sheets

FOREIGN PATENT DOCUMENTS

| | | |
|---|---|---|
| EP | 1 235 107 A1 | 8/2002 |
| EP | 1 403 041 A2 | 3/2004 |
| JP | 7-103171 B | 8/1995 |
| JP | 10-228109 A | 8/1998 |
| JP | 11-38630 A * | 2/1999 |
| JP | 11-38633 A | 2/1999 |
| JP | 11-38645 | 12/1999 |
| JP | 2004-118070 A | 4/2004 |
| JP | 2004212558 A * | 7/2004 |

OTHER PUBLICATIONS

Extended European Search Report Dated Apr. 17, 2008.

* cited by examiner

PLANOGRAPHIC PRINTING PLATE PRECURSOR

CROSS-REFERENCE TO RELATED APPLICATION

This application claims priority under 35 USC 119 from Japanese Patent Application No. 2004-248536, the disclosure of which is incorporated by reference herein.

BACKGROUND OF THE INVENTION

1. Field of the Invention

This invention relates to a negative planographic printing plate precursor for direct image writing with an infrared laser, capable of high speed processing, and in particular, when stacked, to a planographic printing plate precursor with improved adhesion resistance of a surface on the light sensitive layer side of the planographic printing plate precursor to a surface on a support body side of the planographic printing plate precursor.

2. Description of the Related Art

Conventionally PS plates, of a lipophilic light sensitive resin layer provided on a hydrophilic support body, are widely used for planographic printing plate precursors. The plate-making method thereof is normally after mask exposure through a lith film (surface light exposure), obtaining a desired printing plate by dissolving away the non-image areas. Recently, digitalized electronic processing, storing and output of image data using a computer has become common. New image output systems, which are applicable to such digitalized technologies, have variously become useable in practice. As a result of this it has become desirable to directly manufacturing printing plates—computer to plate (CTP)—by scanning according to digitalized image information with light that is highly directionable, like lasers, and not through lith films. Obtaining planographic printing plate precursors which are applicable to such a process has become an important technological challenge.

As such planographic printing plate precursors which can undergo scanning exposure, structures that have a lithophilic photosensitive resin layer (referred to below as a photosentivive layer), which contains a light sensitive compound that can generate active species such as radicals and Bronsted acids when exposed with laser light, on a hydrophilic support body are already on the market.

These planographic printing plate precursors are scanned with a laser according to digital information to generate active species, and by this action the photosensitive layer is rendered insoluble by either physical change or chemical change. Following on from this, by developing processing a negative planographic printing plate can be obtained. In particular, planographic printing plates provided with a hydrophilic support body on which is provided a photo polymerizing type light sensitive layer, including a photopolymerization agent which is superior in photosensitive speed, an addition polymerizable unsaturated ethylene compound, and, as required, an oxidation exclusion protecting layer, are both superior in manufacturability, and further more easy to develop process, have the benefit of good definition and ink adherence, and hence printing plates with desirable printing characteristics can be obtained.

Conventionally, in order to promote the curing reaction of the photosensitive layer, there is a method of providing over the photosensitive layer a protecting layer containing a water soluble polymer, and a method of providing an inorganic material lamellar compound and a protecting layer containing water soluble polymer are known (see, for example, Japanese Patent Application Laid-Open (JP-A) No. 11-38633). However, in a light polymerizing planographic printing plate precursor of such a structure, while by the presence of the protecting layer the curing reaction of the photosensitive layer can be promoted, the sensitivity is not sufficient, and there is a challenge to make it highly sensitive.

Also, regarding the productivity of plate making of the ease of developing processing light polymerizing planographic printing plate precursors, it is becoming important to reduce the time required for the exposure process. In the exposure process, normally, the precursor plates are provided in stacks, with interleaving papers inserted between precursor plate and precursor plate, having the function of preventing adhesion between the precursor plates themselves. Because of this, the inefficiency of having to remove the interleaving papers in the exposing process has become a problem. In order to make the exposing process efficient, it is desirable to improve the adhesion resistance between planographic printing plate precursors themselves, and, by using stacks without interleaving papers interleaved between the precursor plates, be able to eliminate the interleaving paper removal process.

SUMMARY OF THE INVENTION

The present invention has been made in view of the above circumstances and provides the following.

That is, the invention provides a planographic printing plate precursor with improved adhesion resistance, when stacked, of the surface of the photosensitive layer side of a planographic printing plate precursor and the contacting surface of the support body side of the adjacent planographic printing plate precursor.

The inventors of the invention have found that it is possible to satisfy the above needs by adding an inorganic lamellar compound to a protective layer and achieved the present invention.

Namely, the present invention provides a planographic printing plate precursor comprising a support, and a photosensitive layer and a protective layer, which are formed in this sequence on or above the support, wherein: the photosensitive layer comprises an infrared absorbing agent, a polymerization initiating agent, a polymerizable compound and a binder polymer comprising repeating units as represented by the following Formula (i); and the protective layer comprises an inorganic lamellar compound.

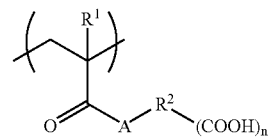

Formula (i)

In Formula (i), $R^1$ represents a hydrogen atom or a methyl group; $R^2$ represents a connecting group having two or more types of atom selected from the group consisting of a carbon atom, a hydrogen atom, an oxygen atom, a nitrogen atom, and a sulfur atom, and having 2 to 82 atoms in total; A represents an oxygen atom or —$NR^3$—, and $R^3$ represents a hydrogen atom or a monovalent hydrocarbon group having 1 to 10 carbon atoms; and n is an integer of 1 to 5.

The expression of "form(ed) in this sequence" herein used means that a photosensitive layer and a protective layer are formed on or above a substrate in this order, and allows to further form other layers such as an intermediate layer or a backcoating layer in accordance with objects.

The present invention further provides a method for forming the planographic printing plate precursor of claim 1, comprising: preparing a dispersion liquid of the inorganic lamellar compound; preparing a protecting layer coating liquid, by blending the dispersion liquid and a binder component; and coating the protecting layer coating liquid over the photosensitive layer so as to form the protecting layer.

While the mechanism of the invention is not clear it is supposed to be as follows.

By the inclusion of inorganic lamellar compound in the protecting layer in the planographic printing plate precursor of the invention, matting properties can be applied to the protecting layer. At the same time, by raising the strength of the film adhesion between the protecting layer forming the surface of the photosensitive layer of a planographic printing plate precursor and the contacting surface of the support body of the adjacent planographic printing plate precursor, when stacked, adhesion can be prevented. This is thought to provide the superior scratch resistance.

DETAILED DESCRIPTION OF THE INVENTION

Figure 1:
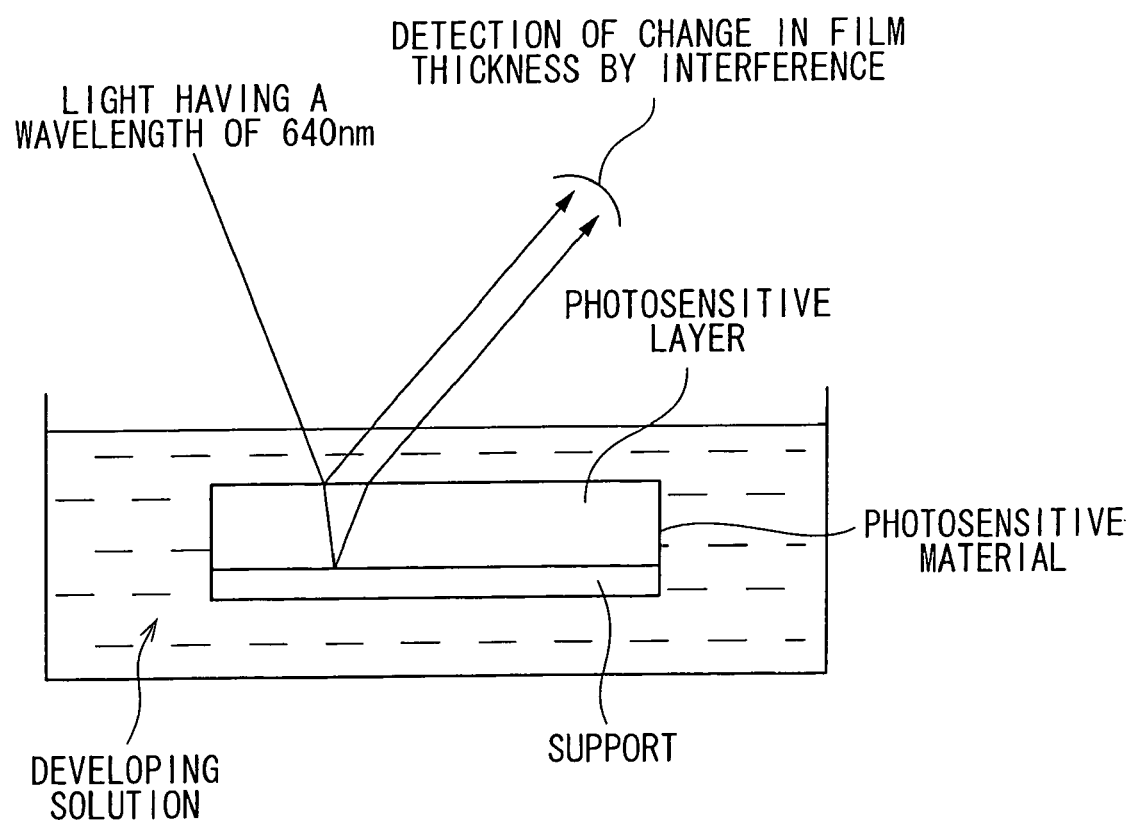
FIG. 1 is a schematic diagram of a configuration of an example of a DRM interference detection device used for measuring dissolution behavior of a photosensitive layer.

Hereinafter, the planographic printing plate precursor of the present invention will be described in detail.

The planographic printing plate precursor of the present invention is characterized by sequentially forming a photosensitive layer containing at least an infrared absorbing agent, a polymerization initiating agent, a polymerizable compound and a specific binder polymer and a protective layer containing at least an inorganic lamellar compound on a support.

Hereinafter, each of the constituents of the planographic printing plate precursor of the present invention will be described in detail.

Protecting Layer

The protecting layer of the invention is characterized by containing inorganic material of a lamellar compound.

The planographic printing plate precursor of the invention, since a photosensitive layer is a polymerizable negative photosensitive layer (described later), and usually exposure is carried out in the atmosphere, is provided thereon with a protecting layer, for the purpose of preventing the permeation of oxygen, moisture, and low molecular weight compounds such as basic materials, that are present in the atmosphere and can hinder the image forming reactions.

By including inorganic material of a lamellar compound in the protective layer provided for such a purpose, the protection layer can be invested with matting properties, and at the same time the strength of the film can be increased. As a result of this, as well as blocking the above oxygen etc, it becomes possible to prevent the deterioration of the protecting layer by, for example, distortion. Furthermore, by investing matting properties in the protecting layer, the planographic printing plate precursor of the invention can suppress adhesion, when stacked, of the surface of the photosensitive layer side (protecting layer) of a planographic printing plate precursor and the contacting surface of the support body side surface of the adjacent planographic printing plate precursor.

The inorganic lamellar compound will be described below.

Inorganic Lamellar compound

In the invention the inorganic lamellar compound used is particles with a thin flat plate-like shape. The following can be used, for example micas such as natural micas, shown by the formula A $(B,C)_{2-5}D_4O_{10}(OH, F, O)_2$ (where: A is K, Na, or Ca; B and C are Fe (II), Fe (III), Mn, Al, Mg, or V; and D is Si or Al), and synthetic micas, as shown by the formula $3MgO \cdot 4SiO \cdot H_2O$, talcs, tainiolite, montmorillonite, saponite, hectorite, and zirconium phosphate.

For the above micas the following natural micas, for example, can be used: muscovite, paragonite, phlogopite, biotite, and lepidolite. And for synthetic micas the following, for example, can be used: non-swelling micas such as fluorophlogopite ($KMg_3(AlSi_3O_{10})F_2$), or potassium tetrasilicate mica ($KMg_{2.5}(Si_4O_{10})F_2$); and swelling micas such as Na tetrasilicic mica $NaMg_{2.5}(Si_4O_{10})F_2$, Na taeniolite or Li taeniolite ($(Na, Li)Mg_2 Li(Si_4O_{10}O)F_2$), montmorillonite type Na hectorite or Li hectorite ($(Na, Li)_{1/8}Mg_{2/5}Li_{1/8}(Si_4O_{10})F_2$), etc. Further, synthetic smectites are also useful.

Among these lamellar compounds, water-swelling synthetic mica is preferably used in the present invention, and fluorine-containing swelling synthetic micas are particularly preferable. That is, when swelling synthetic micas and montmorillonite, saponite, hectorite, and bentonite are formed into layered structures from single crystal lattice layers with thicknesses of between 10 and 15 Angstroms, the substitution of metal atoms within the lattice is significantly greater than other viscous minerals. As a result of this, the lattice layer develops positive charge deficiency, and, in order to remedy that, positive ions of $Na^+$, $Ca^{2+}$, $Mg^{2+}$ are absorbed between the layers. These positive ions present interlayer are called exchange ions, and exchange with various positive ions. In particular when these positive ions are Li+ or Na+, because the ion radius is small, the bonding between the laminar crystal lattices is weak, and swelling due to water is great. In such a state, when shear is applied they easily cleave, forming stable sols in water. This tendency is great with bentonite and swelling synthetic micas, and these are useful for the invention. Swelling synthetic micas are particularly preferable.

For the shape of the particles of the inorganic lamellar compounds of the invention, from the perspective of controlling diffusion, the thickness should be a thin as possible, and the flat face size should be a large as possible, as long as there is no detriment to the smoothness of the coating surface or to the transmission of the activating light. The aspect ratio of the inorganic lamellar compound is preferably 20 or more, more preferably 100 or more, and most preferably 200 or more. The aspect ratio is a ratio of the thickness to the major axis of the particles of lamellar compound, and can be measured, for example, by examination of a projection of the fine particles using a microscope photograph. The effectiveness obtained is greater the greater the aspect ratio.

The size of particles of the inorganic lamellar compound of the invention, in terms of average major axis, is preferably 0.3 to 20 μm, more preferably 0.5 to 10 μm and most preferably 1 to 5 μm. The average thickness of the lamellar compound is preferably 0.1 μm or less, more preferably 0.05 μm or less and most preferably 0.01 μm or less. Specifically, for example for the typical compounds of swelling synthetic micas, the size is of the order of thickness 1 to 50 nm, with a face size (major axis) of 1 to 20 μm.

Regarding the amount contained of the inorganic lamellar compound in the protecting layer, this is preferably in the range of 5 to 55% by mass, relative to the total solid content of the protecting layer, and the range of 10 to 40% by mass is more preferable. If the included amount is less than 5% then there is no adhesion resistance effect, and if the amount is more than 55% then film forming is insufficient and the sensitivity is reduced.

When several types of inorganic material lamellar compounds are used in combination, the total amount of the inorganic material lamellar compounds is preferably within the above ranges of mass ratios.

Binder

The desirable fundamental characteristics of the protecting layer provided on the polymerizable negative photosensitive layer are: low porosity to low molecular weight compounds, such as oxygen; and no practical detriment to the transmission of the exposing light used; good adhesion to the photosensitive layer; and ease of removal after exposure, in the developing process. Such protecting layers have already been devised, and are described in detail in U.S. Pat. No. 3,458, 311, and Japanese Patent Application Publication (JP-B) No. 55-49729. Materials which can be used for forming the protecting layer are, for example, water soluble polymer compounds with good relative crystallinity. Specifically, water soluble polymers such as polyvinyl alcohol, polyvinyl pyrrolidone, acidic celluloses, gelatins, gum arabic, and poly acrylate are known. Among these, by using polyvinyl alcohol as the main component, from the perspective of the fundamental characteristics of blocking oxygen and removal during developing, excellent properties can be achieved.

In the protecting layer of the invention, in addition to the above inorganic lamellar compounds, by using the water soluble compounds as binders, protective layers with various desired characteristics can be obtained.

For a suitable polyvinyl alcohol for using as a binder for the protective layer, in order to have the necessary oxygen blocking ability and water solubility, as long as unsubstituted vinyl alcohol units are included, a proportion can be substituted with esters, ethers and/or acetals. Also, in the same way, a portion can be other copolymer components. Specific examples of polyvinyl alcohols can be 71% to 100% hydrolyzed, with molecular weights in the region of 300 to 2400. Specific examples thereof include PVA-105, PVA-110, PVA-117, PVA-117H, PVA-120, PVA-124, VA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8, KL-318, and KL-506 (all trade names, manufactured by Kuraray Co., Ltd.).

The components of the protecting layer (PVA, choice of inorganic lamellar compounds, use of additives), and coating amount are selected in consideration of the fogging properties and adhesiveness and scratch resistance, in addition to the oxygen blocking properties and removability during developing. Generally, it is favourable from the perspective of sensitivity that the degree of hydrolysis of the PVA used increases (the ratio of unsubstituted vinyl alcohol units included in the protecting layer increases), the film thickness increases, and the oxygen blocking property increases. However, if the oxygen blocking is increased to an extreme then during manufacture, or storage before exposure, unwanted polymerization can take place, and also, during exposing, unwanted fogging, and thickening of the image line can be exhibited. Also, the adhesion of the image areas of the photosensitive layer and the scratch resistance are very important for the handling of the plates. That is, in the lamination of the hydrophilic layer from the water soluble polymer and the lipophilic photosensitive layer, if the adhesion strength is insufficient then delamination and peeling of the layers can easily occur, and defects can occur where portions which peel off can, by inhibiting oxygen polymerization, give bad film curing. In response to this there is a disclosure in U.S. patent application Ser. Nos. 292,501 and 44,563 of a hydrophilic polymer, mainly from polyvinyl alcohol in which is mixed to a proportion of 20 to 60% by mass acrylic based emulsion or water insoluble vinyl pyrrolidone-vinyl acetate copolymer units, laminated onto a photosensitive layer, and obtaining sufficient adhesion.

In the protecting layer of the invention, as long as there is no detriment to the effectiveness of the inclusion of the inorganic material of lamellar compound, then such conventional techniques can be applied.

Also, with the protecting layer of the invention, from the perspective of adhesion strength to the photosensitive layer, sensitivity, the generation of unwanted fogging, combined use of polyvinyl alcohol and polyvinyl pyrrolidone as the binder is possible. Also, the content ratio (by mass) of polyvinyl alcohol/polyvinyl pyrrolidone is preferably 3/1 or less.

Forming the protecting layer including inorganic lamellar compound In the invention, the protecting layer including inorganic lamellar compound can be formed by: preparing a dispersion liquid of the inorganic lamellar compound; forming a protecting layer coating liquid of a blend of the dispersion liquid and the above binder component(s) (or aqueous solution of dissolved binder component(s)); and coating over (on or above) the photosensitive layer.

First, examples of the general dispersion methods for the inorganic lamellar compounds used in the protecting layer will be given. First 5 to 10 parts by mass of a swelling lamellar compound, one of the examples given of a favorable inorganic lamellar compound, is added to 100 parts by mass of water and sufficient mixed into the water. After swelling up, it is dispersed using a dispersion apparatus. As a dispersion apparatus the following can be used: apparatuses which directly apply mechanical force such as various mills; high speed agitation dispersers which have a large shear force; dispersers which apply strong ultra-sound wave energy. Specifically ball mills, sand mills, visco mills, colloid mills, homogenizers, dissolvers, polytrons, homomixers, homoblenders, Keddy mill, jet agitator, capillary emulsifier, liquid sirem, an electromagnetic strain type ultrasonic generator and an emulsifier with emulsifier having a poleman whistle. By using the above method a 2 to 15% by mass dispersion of the lamellar inorganic compound is produced, of exceedingly good storage stability with a high viscosity or as a gel.

When using this dispersion to prepare the protecting layer coating liquid, it is preferable that it is diluted with water, and then thoroughly stirred before blending with the binder components (or aqueous liquid into which the binder components have been dissolved).

For this protecting layer coating liquid, in order to increase the coatability known additives such as surfactants and coating material improver water soluble plasticizers can be added. For water soluble plasticizers, for example, propionic amide, cyclohexane diol, glycerin, and sorbitol can be used. Also, soluble (meta) acrylic based polymers can be added. Furthermore, known additives can be added to increase the photosensitivity, adhesion, and coating liquid stability over time.

Methods for coating a protective layer used in the invention are not particularly limited, and those described in, for example, U.S. Pat. No. 3,458,311 and JP-B No. 55-49729, can be appropriately used.

A coating amount of the protective layer in the invention when dry is preferably 0.5 to 2.0 g/m$^2$, and more preferably 0.75 to 1.5 g/m$^2$. When the amount is less than 0.5 g/m$^2$, film strength of the protective layer cannot be maintained and causes deterioration in scratch resistance. When the amount exceeds 2.0 g/m$^2$, diffusion of light which incidents to the protective layer by exposure occurs to cause deterioration in image quality.

Photosensitive Layer

The photosensitive layer used in the planographic printing plate of the present invention is a negative polymerizable photosensitive layer which necessarily contains an infrared absorbing agent, a polymerization initiating agent, a polymerizable compound and a specific binder polymer, and which may further contain a coloring agent and/or any other arbitrary ingredients in accordance with necessity.

The negative polymerizable photosensitive layer used in the invention is sensitive to infrared light and thus to light emitted by an infrared laser, which is useful for CTP. The infrared absorbing agent contained herein is highly sensitive to light emitted by an infrared laser and electronically excited by irradiation (exposure) of the infrared laser. The electron transfer, energy transfer, and/or heat generation (light-heat conversion) due to the infrared absorbing agent electronically excited act on the polymerization initiator contained in the photosensitive layer, and cause it to chemically change and to generate a free radical.

Examples of mechanism for generating a radical include: (1) heat generated in light-heat conversion by the infrared absorbing agent causes thermal decomposition of the polymerization initiator described below (e.g., a sulfonium salt) to generate a free radical; (2) an excited electron generated by the infrared absorbing agent moves to the polymerization initiator (e.g., an activated halogen compound) and the initiator then generates a free radical; and (3) an electron is pulled out of the polymerization initiator (e.g., a borate compound) by the excited infrared absorbing agent, generating a free radical. The generated radical causes a polymerization reaction of the polymerizable compound and the exposed portions are then cured to form image portions.

The planographic printing plate precursor used in the invention is particularly suitable for plate making wherein an image is directly formed on the precursor with an infrared laser beam having a wavelength of 750 nm to 1,400 nm, and has an image-forming ability higher than that of conventional planographic printing plate precursors, since the photosensitive layer of the precursor used in the invention contains an infrared absorbing agent.

Hereinafter, each component of the photosensitive layer of the planographic printing plate precursor used in the invention will be described.

Infrared Absorbing Agent

The photosensitive layer of the planographic printing plate precursor used in the invention contains an infrared absorbing agent for the purpose of attaining energy transfer (electron transfer) and light-heat conversion.

The infrared absorbing agent is highly sensitive to light emitted by an infrared laser and electronically excited by irradiation (exposure) of the infrared laser, and is useful for the electron transfer, energy transfer, and/or heat generation (light-heat conversion) due to the infrared absorbing agent electronically excited acting on the polymerization initiator described later, and efficiently causing the polymerization initiator to chemically change and to generate a free radical.

The infrared absorbing agent used in the invention is preferably a dye or pigment having an absorption maximum at a wavelength of 750 nm to 1,400 nm.

Commercially available dyes and known dyes described in literature, for example, in "Dye Handbook" (edited by Socity of Synthetic Organic Chemistry and published in 1970) may be used as the dye. Typical examples thereof include azo dyes, metal complex salt azo dyes, pyrazolone azo dyes, naphthoquinone dyes, anthraquinone dyes, phthalocyanine dyes, carbonium dyes, quinonimine dyes, methine dyes, cyanine dyes, squalelium dyes, pyrylium salts, and metal thiolate complexes.

The dye is preferably a cyanine dye described in JP-A Nos. 58-125246, 59-84356, or 60-78787; a methine dye described in JP-A Nos. 58-173696, 58-181690, or 58-194595; a naphthoquinone dye described in JP-A Nos. 58-112793, 58-224793, 59-48187, 59-73996, 60-52940, or 60-63744; a squalelium dye described in JP-A No. 58-112792; and/or a cyanine dye described in U.K. Patent No. 434,875.

In addition, preferably used are infrared-absorbing sensitizers described in U.S. Pat. No. 5,156,938; substituted arylbenzo(thio)pyrylium salts described in U.S. Pat. No. 3,881,924; trimethine thiapyrylium salts described in JP-A No. 57-142645 (U.S. Pat. No. 4,327,169); pyrylium compounds described in JP-A No. 58-181051, 58-220143, 59-41363, 59-84248, 59-84249, 59-146063, and 59-146061; cyanine dyes described in JP-A No. 59-216146, pentamethine thiopyrylium salts described in U.S. Pat. No. 4,283,475; and pyrylium compounds disclosed in JP-B Nos. 5-13514 and 5-19702. Other preferable examples of the dyes include near infrared-absorbing dyes represented by Formulae (I) and (II) in U.S. Pat. No. 4,756,993.

Still other preferable examples of the infrared ray-absorbing dyes used in the invention include the following particular indolenine cyanine dyes disclosed in Japanese Patent Application Nos. 2001-6326 and 2001-237840.

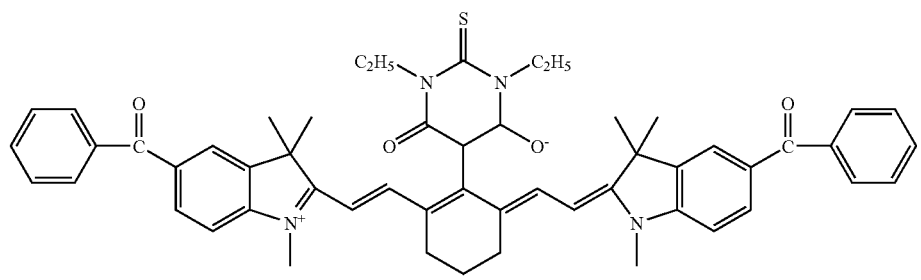

-continued

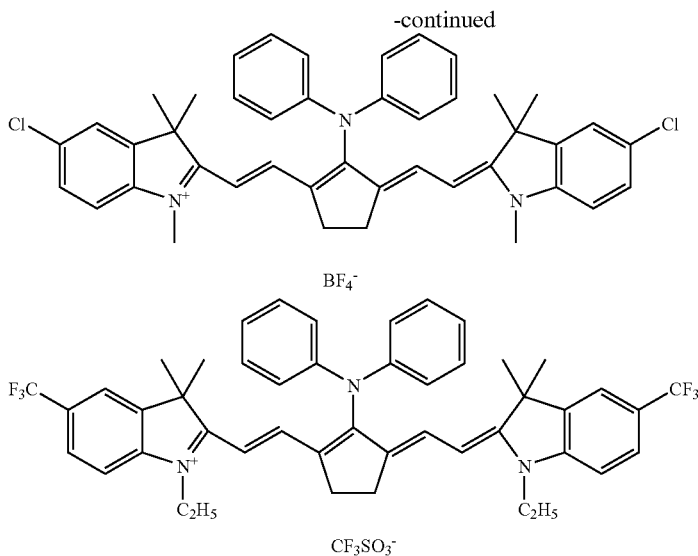

Among these dyes, particularly preferable examples thereof include cyanine dyes, squalelium dyes, pyrylium salts, nickel thiolate complexes, and indolenine cyanine dyes. More preferable examples thereof include cyanine dyes and indolenine cyanine dyes, and particularly preferable examples thereof include the cyanine dyes represented by the following Formula (a).

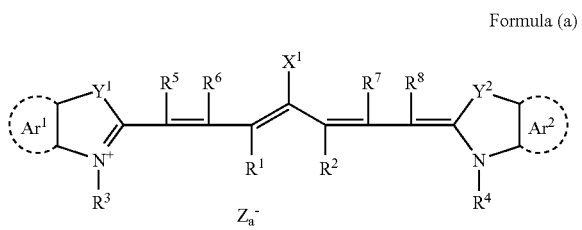

Formula (a)

In Formula (a), $X^1$ represents a hydrogen atom, a halogen atom, —$NPh_2$, $X^2$-$L^1$, or the following group. $X^2$ represents an oxygen, nitrogen, or sulfur atom; and $L^1$ represents a hydrocarbon group having 1 to 12 carbon atoms, a hetero atom-containing aromatic ring, or a hetero atom-containing hydrocarbon group having 1 to 12 carbon atoms. The hetero atom represents a nitrogen, sulfur, oxygen, halogen, or selenium atom. $Xa^-$ has the same definition as that of $Za^-$ described later, and Ra represents a hydrogen atom, or a substituent group selected from the group consisting of an alkyl group, an aryl group, a substituted or unsubstituted amino group, and a halogen atom.

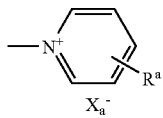

$R^1$ and $R^2$ each independently represent a hydrocarbon group having 1 to 12 carbon atoms. $R^1$ and $R^2$ each are preferably a hydrocarbon group having two or more carbon atoms from the viewpoint of storage stability of a photosensitive layer coating solution. $R^1$ and $R^2$ particularly preferably form a five- or six-membered ring.

$Ar^1$ and $Ar^2$ may be the same as or different from each other and each represent an aromatic hydrocarbon group which may have one or more substituents. Typical examples of the aromatic hydrocarbon group include benzene and naphthalene rings. Typical examples of the substituent(s) include hydrocarbon groups having 12 or less carbon atoms, halogen atoms, and alkoxy groups having 12 or less carbon atoms. $Y^1$ and $Y^2$ may be the same as or different from each other, and each represent a sulfur atom or a dialkylmethylene group having 12 or less carbon atoms. $R^3$ and $R^4$ may be the same as or different from each other and each represent a hydrocarbon group having 20 or less carbon atoms which may have one or more substituents. Typical examples of the substituent(s) include alkoxy groups having 12 or less carbon atoms, carboxyl groups, and a sulfo group. $R^5$, $R^6$, $R^7$ and $R^8$ may be the same as or different from each other, and each represent a hydrogen atom or a hydrocarbon group having 12 or less carbon atoms. The substituent is preferably a hydrogen atom from the viewpoint of availability of raw materials. In addition, $Za^-$ represents a counter anion. However, $Za^-$ does not exist if the cyanine dye represented by Formula (a) has in the structure thereof an anionic substituent, which cancels the electric charge of the quaternary nitrogen atom. The $Za^-$ ion is preferably a halide ion, a perchlorate ion, a tetrafluoroborate ion, a hexafluorophosphate ion, or a sulfonate ion from the viewpoint of storage stability of a photosensitive layer coating solution, and more preferably a perchlorate ion, a hexafluorophosphate ion, or a arylsulfonate ion.

Specific examples of the cyanine dye represented by Formula (a) suitable for use in the invention include those described in paragraph numbers [0017] to [0019] of JP-A No. 2001-133969.

Examples of those particularly preferably used in the invention further include particular indolenine cyanine dyes disclosed in Japanese Patent Application Nos. 2001-6326 and 2001-237840 described above.

Among these, the dyes containing no halide ion as the counter ion are particularly preferable.

Any of commercially available pigments and the pigments described in "Color Index (C.I.) Handbook", "Pigment Handbook" (Edited by Japan Society of Pigment technologies, and published in 1977), "Latest Pigment Application Technologies" (CMC Publishing, 1986), and "Printing Ink technologies" (CMC Publishing, 1984) may be used as the pigment for use in the invention.

Examples of the pigment include black pigments, yellow pigments, orange pigments, brown pigments, red pigments, purple pigments, blue pigments, green pigments, fluorescent pigments, metal powder pigments, and polymer-bound dyes. Specific examples thereof include insoluble azo pigments, azolake pigments, condensation azo pigments, chelate azo pigments, phthalocyanine pigments, anthraquinone pigments, perylene and perynone pigments, thioindigo pigments, quinacridone pigments, dioxazine pigments, isoindolinone pigments, quinophtharone pigments, dyed lake pigments, azine pigments, nitroso pigments, nitro pigments, natural pigments, fluorescent pigments, inorganic pigments, and carbon black. Among these pigments, preferable is carbon black.

These pigments may be used with or without surface treatment thereof. Examples of methods for the surface treatment include a method of coating a resin or wax onto the surface of a pigment, a method for attaching a surfactant to a pigment, and a method of binding a reactive substance (e.g., a silane coupling agent, an epoxy compound, and/or a polyisocyanate) to a pigment surface. These surface treatment methods are described in "Properties and Applications of Metal Soaps" (Saiwai Shobo), "Printing Ink technologies" (CMC Publishing, 1984) and "Latest Pigment Application Technologies" (CMC Publishing, 1986).

The diameter of pigment particles is preferably in the range of 0.01 to 10 μm, more preferably in the range of 0.05 to 1 μm, and still more preferably in the range of 0.1 to 1 μm. The pigment particles having a diameter in this preferable range can be dispersed uniformly in the photosensitive layer, allowing production of a uniform photosensitive layer.

Any known dispersion method commonly practiced in the art for production of inks and toners may be used as a method of dispersing the pigment. Examples of a dispersing machine include an ultrasonic dispersing machine, a sand mill, an attritor, a pearl mill, a super mill, a ball mill, an impeller, a disperser, a KD mill, a colloid mill, a dynatron, a three roll mill, and a pressurizing kneader. Such dispersing machines are described in detail in "Latest Pigment Application Technologies" (CMC Publishing, 1986).

When contained in the photosensitive layer of the planographic printing plate precursor used in the invention, the infrared absorbing agent may be contained in a layer including other components or in a layer other than that including other components.

The infrared absorbing agent is preferably contained in an amount of 0.01 to 50%, and preferably 0.1 to 10% by mass with respect to the total solid matter in the photosensitive layer from the viewpoints of uniformity and durability of photosensitive layer. If the absorbing agent is a dye, the amount is particularly preferably 0.5 to 10% by mass. If the absorbing agent is a pigment, the amount is particularly preferably 0.1 to 10% by mass.

Polymerization Initiator

The polymerization initiator for use in the invention has a function to initiate and advance curing reaction of the polymerizable compound described later. Any compound that, when energy is applied thereto, decomposes to generate an active radical, such as thermal decomposition-type radical generators that, when heat is applied thereto, decomposes to generate a free radical, electron transfer-type radical generators that accept the excited electron of an infrared absorbing agent to generate a free radical, and electron transfer-type radical generators that supply an electron therefrom to an excited infrared absorbing agent to generate a free radical, may be used as the polymerization initiator. Examples thereof include onium salts, activated halogen compounds, oxime ester compounds, and borate compounds. Two or more of these compounds may be used in combination. In the invention, the polymerization initiator is preferably an onium salt and more preferably a sulfonium salt.

Examples of the sulfonium salt polymerization initiator suitable for use in the invention include an onium salt represented by the following Formula (1).

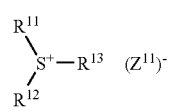

Formula (1)

In Formula (1), $R^{11}$, $R^{12}$ and $R^{13}$ may be the same as or different from each other, and each represent a hydrocarbon group having 20 or less carbon atoms which may have one or more substituents. Typical examples of the substituent(s) include halogen atoms, a nitro group, alkyl groups having 12 or less carbon atoms, alkoxy groups having 12 or less carbon atoms, and aryloxy groups having 12 or less carbon atoms. $(Z^{11})^-$ represents a counter ion selected from the group consisting of a halide ion, a perchlorate ion, a tetrafluoroborate ion, a hexafluoro phosphate ion, a carboxyate ion, and a sulfonate ion, and is preferably a perchlorate ion, a hexafluorophosphate ion, a carboxyate ion, or an arylsulfonate ion.

Specific examples of the onium salt represented by Formula (1) ([OS-1] to [OS-12]) are shown below but the invention is not limited by the examples.

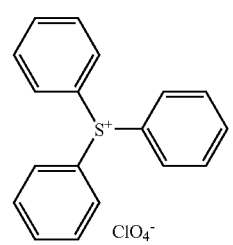

[OS-1]

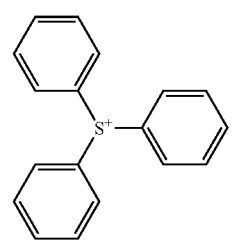

[OS-2]

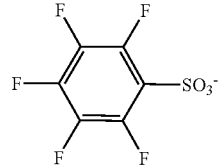

-continued
[OS-3]
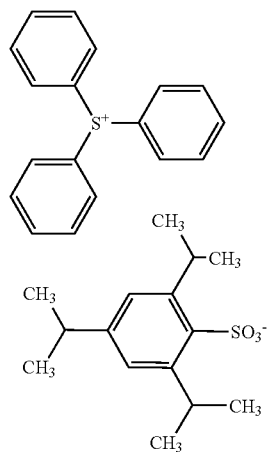
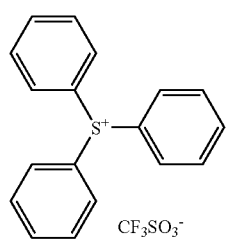
[OS-4]
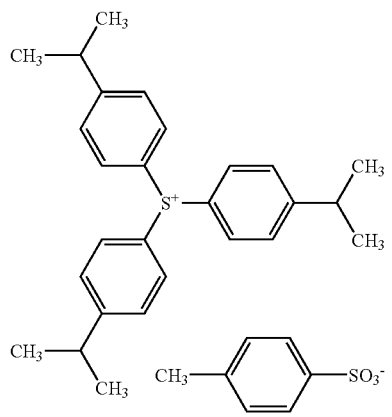
[OS-5]
[OS-6]
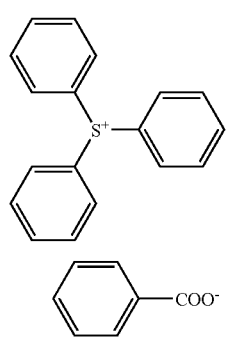
-continued
[OS-7]
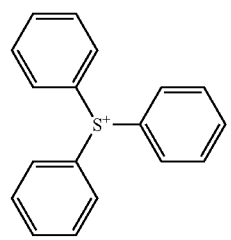
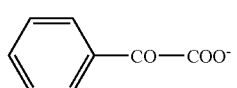
[OS-8]
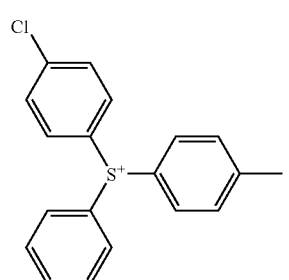
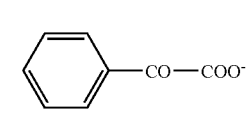
[OS-9]
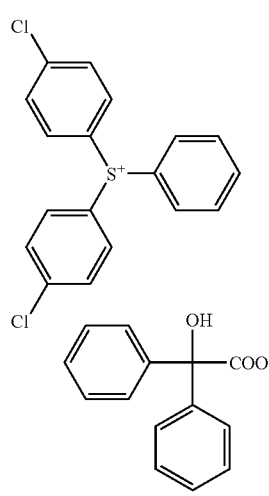
[OS-10]
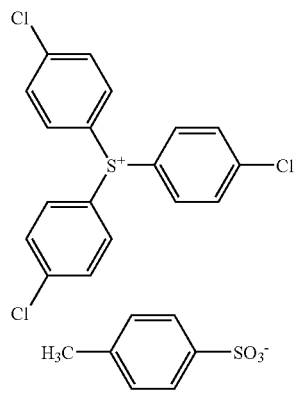

-continued

[OS-11]

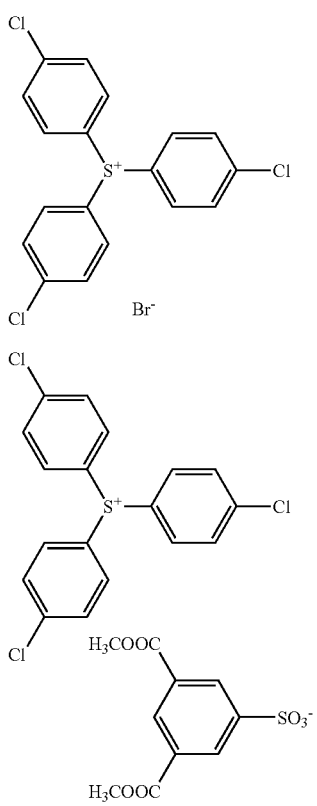

[OS-12]

In addition to the compounds described above, a particular aromatic sulfonium salt described in JP-A Nos. 2002-148790, 2002-148790, 2002-350207, and 2002-6482 may also be preferably used.

A polymerization initiator (other radical generator) other than the sulfonium salt polymerization initiator can also be used in the invention. Examples of other radical generators include onium salts other than sulfonium salts, triazine compounds having a trihalomethyl group, peroxides, azo polymerization initiators, azide compounds, quinone diazide, activated halogen compounds, oxime ester compounds, and triaryl monoalkyl borate compounds. Among them, an onium salt is preferable, since it is highly sensitive. In addition, a mixture containing a sulfonium salt polymerization initiator as the essential component and one of other polymerization initiators (radical generators) may also be used.

Other onium salt suitable for use in the invention can be an iodonium salt and/or a diazonium salt. In the invention, the onium salt does not function as an acid generator but functions as an initiator for radical polymerization.

Specific examples of other onium salt for use in the invention include onium salts represented by the following Formulae (2) and (3).

$$Ar^{21}-I^+-Ar^{22}(Z^{21})^-$$ Formula (2)

$$Ar^{31}-N^+\equiv N(Z^{31})^-$$ Formula (3)

In Formula (2), $Ar^{21}$ and $Ar^{22}$ each independently represent an aryl group having 20 or less carbon atoms which may have one or more substituents. If the aryl group is substituted, typical examples of the substituent(s) include halogen atoms, a nitro group, alkyl groups having 12 or less carbon atoms, alkoxy groups having 12 or less carbon atoms, and aryloxy groups having 12 or less carbon atoms. $(Z^{21})^-$ represents a counter ion having the same meaning as that of $(Z^{11})^-$.

In Formula (3), $Ar^{31}$ represents an aryl group having 20 or less carbon atoms which may have one or more substituents. Typical examples of the substituent(s) include halogen atoms, a nitro group, alkyl groups having 12 or less carbon atoms, alkoxy groups having 12 or less carbon atoms, aryloxy groups having 12 or less carbon atoms, alkylamino groups having 12 or less carbon atoms, dialkylamino groups having 12 or less carbon atoms, arylamino group having 12 or less carbon atoms, and diarylamino groups having 12 or less carbon atoms. $(Z^{31})^-$ represents a counter ion having the same meaning as that of $(Z^{11})^-$.

Hereinafter, typical examples of the onium salt represented by Formula (2) ([OI-1] to [OI-10]), and the onium salt represented by Formula (3) ([ON-1] to [ON-5]) suitable for use in the invention are shown below, but the invention is not limited by them.

[OI-1]

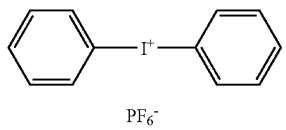

[OI-2]

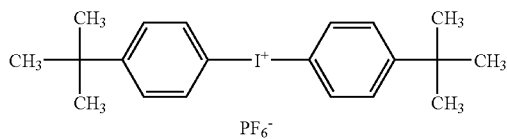

[OI-3]

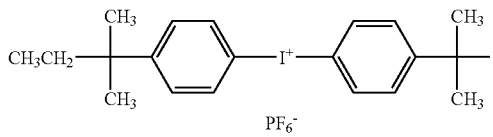

[OI-4]

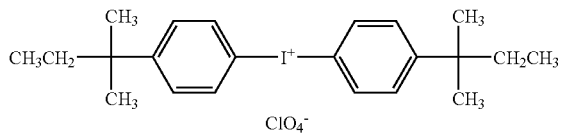

[OI-5]

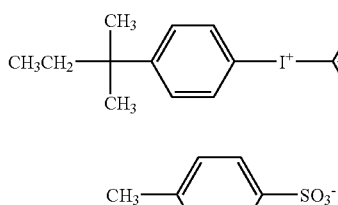

[OI-6]

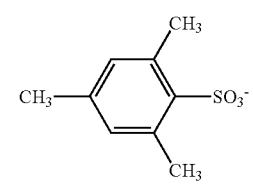

-continued
[01-7]
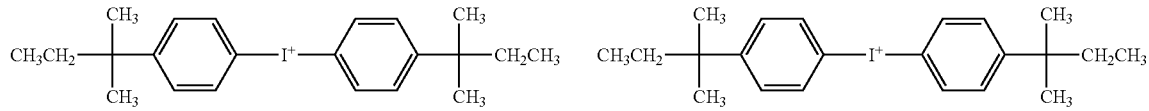
[01-8]
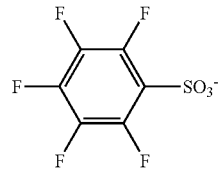
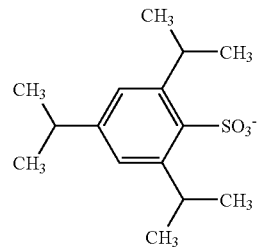
[01-9]
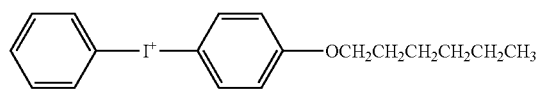
[01-10]
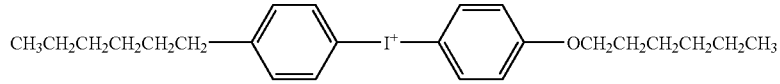
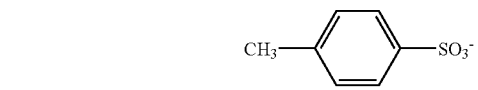
[ON-1]
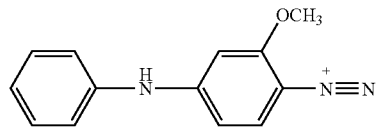
[ON-2]
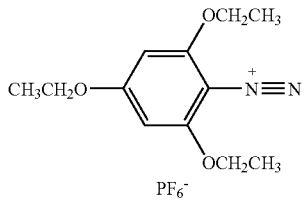
[ON-3]
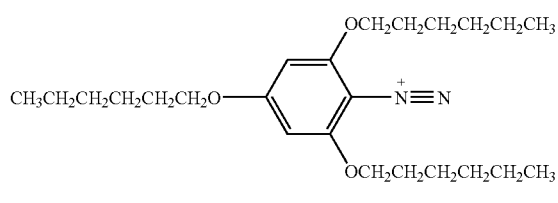
[ON-4]
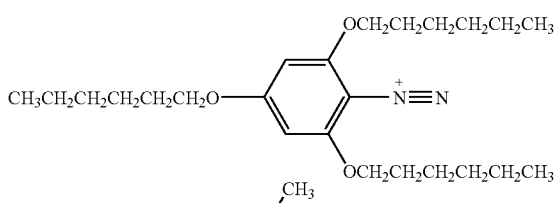
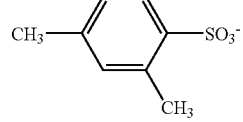
[ON-5]
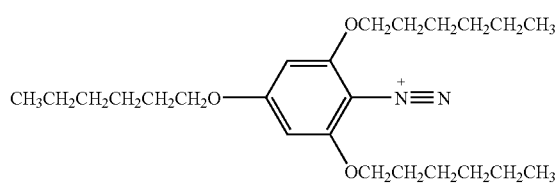
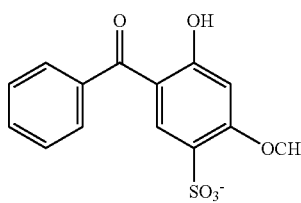

Specific examples of the onium salt suitable for use in the invention as the polymerization initiator (radical generator) include those described in JP-A No. 2001-133696.

The polymerization initiator (radical generator) used in the invention preferably has a maximum absorption wavelength of 400 nm or less and more preferably 360 nm or less. When the polymerization initiator has an absorption wavelength in the ultraviolet region, it becomes possible to handle the planographic printing plate precursor under incandescent light.

The total amount of the polymerization initiator used in the invention is preferably 0.1 to 50%, more preferably 0.5 to 30%, and still more preferably 1 to 20% by mass with respect to the total solid matter in the photosensitive layer from the viewpoints of sensitivity and prevention of stains in non-image portions during printing.

In the invention, one polymerization initiator may be used, or two or more initiators can be used together. When two or more polymerization initiators are used together, two or more sulfonium salt polymerization initiators may be used without other types of polymerization initiator, or a sulfonium salt polymerization initiator and any other polymerization initiator may be used in combination.

When a sulfonium salt polymerization initiator and other polymerization initiator are used in combination, the ratio (mass ratio) of the former and the latter is preferably 100/1 to 100/50 and more preferably 100/5 to 100/25.

The polymerization initiator and other components may be contained in the same layer or in different layers.

Use of a high-sensitivity sulfonium salt polymerization initiator which is preferable as the polymerization initiator in the photosensitive layer of the planographic printing plate precursor used in the invention allows efficient progress of the radical polymerization reaction and formation of image portions having extremely high strength. Accordingly, when such a polymerization initiator is used together with a protective layer having a high oxygen-blocking function and described later, a planographic printing plate having high image-portion strength and consequently having further improved printing durability can be made. In addition, the sulfonium salt polymerization initiator, which is superior in storability over time, effectively inhibits undesirable polymerization reaction when the planographic printing plate precursor is stored.

Polymerizable Compound

The polymerizable compound for use in the invention is an addition-polymerizable compound having at least one ethylenic unsaturated double bond, and is selected from compounds having at least one, and preferably two or more ethylenic unsaturated bonds. These compounds are well known in the art, and any thereof may be used in the invention without restriction. These compounds are present in various chemical forms of monomers, prepolymers such as dimer, trimer and oligomer, and mixtures thereof, and copolymers thereof. Examples of the monomer and copolymer thereof include unsaturated carboxylic acids (e.g., acrylic acid, methacrylic acid, itaconic acid, crotonic acid, isocrotonic acid, and maleic acid) and esters and amides thereof. Other examples thereof include esters of unsaturated carboxylic acids and aliphatic polyhydric alcohol compounds, and amides of unsaturated carboxylic acids and aliphatic polyvalent amine compounds. An adduct of an unsaturated carboxylic acid ester or amide having a nucleophilic substituent such as a hydroxyl group, an amino group, or a mercapto group, and a monofuctional or multifunctional isocyanate or an epoxy compound, and/or a dehydration condensation product from a monofuctional or multifunctional carboxylic acid and a monofuctional or multifunctional isocyanate or an epoxy compound is also preferably used. In addition, preferable are an adduct of an unsaturated carboxylic acid ester or amide having an electrophilic substituent such as an isocyanate group, or an epoxy group, and a monofuctional or multifunctional alcohol, amine, or thiol, and/or a substitution product from an unsaturated carboxylic acid ester or amide having a leaving substituent such as a halogen atom, or a tosyloxy group, and a monofuctional or multifunctional alcohol, amine, or thiol. Further, it is possible to use a compound which is obtained in the same manner as those of the above compounds except that the unsaturated carboxylic acid is replaced with an unsaturated phosphonic acid, styrene, or vinyl ether.

Specific examples of the monomers for the esters of an aliphatic polyvalent alcohol compound and an unsaturated carboxylic acid include acrylic esters, methacrylic esters, itaconic esters, crtonic esters, isocrtonic ester and maleic esters. Examples of the acrylic esters include ethylene glycol diacrylate, triethylene glycol diacrylate, 1,3-butanediol diacrylate, tetramethylene glycol diacrylate, propylene glycol diacrylate, neopentyl glycol diacrylate, trimethylol propane triacrylate, trimethylol propane tri(acrlyloyloxypropyl)ether, trimethylol ethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol haxaacrylate, sorbitol triacrylate, sorbitol tetraacrylate, sorbitol pentaacrylate, sorbitol haxaacrylate, tri (acrlyloyloxyethyl)isocyanurate, and polyester acrylate oligomers.

Examples of the methacrylic esters include tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis(p-(3-methacryloxy-2-hydroxypropoxy) phenyl)dimethyl methane, and bis-(p-(methacryloxyethoxy) phenyl)dimethyl methane.

Examples of the itaconic esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. Examples of the crotonic esters include ethylene glycol dicrotonate, tetramethylene glycol dicrotonate, pentaerythritol dicrotonate, and sorbitol tetradicrotonate. Examples of the isocrotonic esters include ethylene glycol diisocrotonate, pentaerythritol diisocrotonate, and sorbitol tetraisocrotonate. Examples of the maleic esters include ethylene glycol dimaleate, triethylene glycol dimaleate, pentaerythritol dimaleate, and sorbitol tetramaleate.

Other examples of the esters include esters derived from aliphatic alcohol described in JP-B Nos. 46-27926 and 51-47334, and JP-A No. 57-196231; compounds having an aromatic skeleton described in JP-A Nos. 59-5240, 59-5241, and 2-226149; and compounds having an amino group described in JP-A No. 1-165613. Further, the above ester monomers may also be used as a mixture.

Specific examples of the monomers for the amides of an aliphatic polyvalent amine compound and an unsaturated carboxylic acid include methylene bis-acrylamide, methylene bis-methacrylamide, 1,6-hexamethylene bis-acrylamide, 1,6-hexamethylene bis-methacrylamide, diethylenetriamine trisacrylamide, xylylene bisacrylamide, and xylylene bismethacrylamide. Examples of other preferable amide monomers include compounds having a cyclohexylene structure described in JP-B No. 54-21726.

In addition, urethane addition-polymerizable compounds produced in accordance with addition reaction of an isocyanate and a hydroxyl group-containing compound are also preferable, and specific examples thereof include urethane compounds containing two or more polymerizable vinyl groups described in JP-B No. 48-41708, which are prepared by addition-reacting a vinyl monomer containing a hydroxyl group and represented by the following Formula with a polyisocyanate compound having two or more isocyanate groups in the molecule.

CH$_2$=C(R$_a$)COOCH$_2$CH(R$_b$)OH

In the formula, R$_a$ and R$_b$ each represent H or CH$_3$.

Additionally, urethane acrylates described in JP-A No. 51-37193, and JP-B Nos. 2-32293 and 2-16765; and urethane compounds having an ethylene oxide main chain described in JP-B Nos. 58-49860, 56-17654, 62-39417, and 62-39418 are also preferable. Further, When the addition-polymerizable compounds having an amino structure or a sulfide structure in the molecule and described in JP-A Nos. 63-277653, 63-260909, and 1-105238 is contained in a photopolymerizable composition, the composition becomes extremely superior in sensitization speed.

Examples thereof further include polyester acrylates described in JP-A No. 48-64183, and JP-B Nos. 49-43191 and 52-30490, multifunctional acrylates and methacrylates obtained by reacting an epoxy resin with a (meth)acrylic acid. Still other examples include particular unsaturated compound described in JP-B Nos. 46-43946, 1-40337, and 1-40336, and vinyl phosphonic acid compounds described in JP-A No. 2-25493. In some cases, compounds having a perfluoroalkyl group and described in JP-A No. 61-22048 are preferably used. In addition, a photo-curable monomer or oligomer described in J. Adhesion Soc. Jpn, vol. 20, No. 7, pp. 300 to 308 (1984) may also be used.

The detail of the structure of the addition-polymerizable compound and a method of using the same, for example, the number of types of such compounds used, and the use amount, may be determined arbitrarily according to desired final performance. For example, the compounds are selected as follows. The compound preferably has many unsaturated groups per molecule, and thus bivalent or higher-valent compounds are preferable from the viewpoint of sensitization speed. In addition, trivalent or higher-valent compounds are preferable to increase strength of image portions, i.e., a cured film. Further, it is effective to use compounds having different valencies and polymerizable groups (e.g., acrylic ester, methacrylic ester, a styrene compound, and/or a vinyl ether compound) to adjust both photosensitivity and strength of the resulting image portions. A high-molecular weight compound or a highly hydrophobic compound has high photosensitive speed and film strength, but may have low development speed and may precipitate in a developing solution. Further, compatibility between the addition-polymerizable compound and other components (e.g., a binder polymer, an initiator, or a coloring agent) and dispersibility thereof in a photosensitive layer are also important factors in selecting or using the addition-polymerizable compound. For example, use of a low-purity compound or a mixture of two or more addition-polymerizable compounds may increase the compatibility.

In addition, a compound having a specific structure may be selected for use in the planographic printing plate precursor used in the invention for the purpose of increasing adhesiveness between the photosensitive layer, and the support or the protective layer.

The content of the addition-polymerizable compound in the photosensitive layer composition is preferably in the range of 5 to 80% and more preferably in the range of 40 to 75% by mass with respect to the solid matter in the photosensitive layer composition from the viewpoints of sensitivity, phase separation, adhesiveness of the photosensitive layer, and the precipitating property thereof in the developing solution.

The addition-polymerizable compound may be used singly, or two or more polymerizable compounds may be used in combination. In addition, the structure, composition, and addition amount of the addition-polymerizable compound may be selected arbitrarily, considering the extent of polymerization inhibition by oxygen, resolution, fogging, change in refractive index, and surface adhesiveness. Further, the planographic printing plate precursor used in the invention may have other layers such as an undercoat or an overcoat.

Specific Binder Polymer

The binder polymer used in the invention has a repeating unit represented by the following Formula (i).

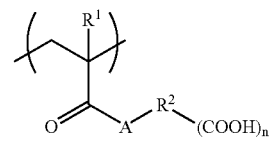

Formula (i)

In Formula (i), R$^1$ represents a hydrogen atom or a methyl group; R$^2$ represents a connecting group having two or more types of atom selected from the group consisting of a carbon atom, a hydrogen atom, an oxygen atom, a nitrogen atom, and a sulfur atom, and having 2 to 82 atoms in total; A represents an oxygen atom or —NR$^3$—, and R$^3$ represents a hydrogen atom or a monovalent hydrocarbon group having 1 to 10 carbon atoms; and n is an integer of 1 to 5.

R$^1$ in Formula (i) represents a hydrogen atom or a methyl group, and is preferably a methyl group.

The connecting group represented by R$^2$ in Formula (i) has two or more atoms selected from the group consisting of a carbon atom, a hydrogen atom, an oxygen atom, a nitrogen atom, and a sulfur atom and has 2 to 82 atoms in total, preferably 2 to 50 atoms, and more preferably 2 to 30 atoms. When the group has a substituent, the total number of atoms of the connecting group includes the number of the atoms of the substituent. More specifically, the number of the atoms of the main chain of the connecting group represented by R$^2$ is preferably 1 to 30, more preferably 3 to 25, and still more preferably 4 to 20, and most preferably 5 to 10. "The main chain of the connecting group" in the invention is an atom or an atomic group used only to connect "A" and the terminal group in Formula (i). If there are multiple routes between them, an atom or atomic group constituting a route having the smallest number of atoms. Accordingly, if the connecting group has a cyclic structure, the number of atom(s) to be counted depends on the connection position of the terminal group (e.g., an ortho-, meta-, or para-position).

More specific examples thereof include substituted and unsubstituted alkylenes, and substituted and unsubstituted arylenes. Further, the connecting group may have a structure wherein two or more of these bivalent groups are bound to each other via an amide bond or ester bond.

Examples of connecting groups having a chain structure include ethylene, and propylene. Such a connecting group can have a structure wherein two or more of these alkylenes are bound to each other via an ester bond.

Among these, the connecting group represented by $R^2$ in Formula (i) is preferably a hydrocarbon group having an alicyclic structure having 3 to 30 carbon atoms and a valency of (n+1). More specific examples thereof include hydrocarbon groups having a valency of (n+1) and prepared by removing (n+1) hydrogen atoms on carbon atoms of compounds having an alicyclic structure and optionally at least one substituent, such as cyclopropane, cyclopentane, cyclohexane, cycloheptane, cyclooctane, cyclodecane, dicyclohexyl, tercyclohexyl, and norbornane. Further, $R^2$ preferably has 3 to 30 carbon atoms, including carbon atoms of the substituent(s).

One or more carbon atoms of the compound having an alicyclic structure may be replaced with one or more hetero atoms selected from a nitrogen atom, an oxygen atom, and a sulfur atom. From the viewpoint of printing durability, $R^2$ is preferably an alicyclic hydrocarbon group having 5 to 30 carbon atoms, containing two or more rings, having a valency of (n+1) and optionally having at least one substituent, such as condensed polycyclic aliphatic hydrocarbon, cross-linked alicyclic hydrocarbon, spiro aliphatic hydrocarbon, and that in which aliphatic hydrocarbon rings are connected to each other directly or via a connecting group. When the compound has one or more substituent(s), the number of carbon atoms of the compound include those of the substituent(s).

The connecting group represented by $R^2$ is particularly preferably a group having a main chain thereof having 5 to 10 atoms, and preferably has a chain structure having an ester bond or at least one of the cyclic structures described above.

The substituent(s) that may be introduced to the connecting group represented by $R^2$ can be a monovalent non-metal atomic group excluding hydrogen, and specific examples thereof include halogen atoms (—F, —Br, —Cl, and —I), a hydroxyl group, alkoxy groups, aryloxy groups, a mercapto group, alkylthio groups, arylthio groups, alkyldithio groups, aryldithio groups, an amino group, N-alkylamino groups, N,N-dialkylamino groups, N-arylamino groups, N,N-diarylamino groups, N-alkyl-N-arylamino groups, acyloxy groups, carbamoyloxy groups, N-alkylcarbamoyloxy groups, N-arylcarbamoyloxy groups, N,N-dialkylcarbamoyloxy groups, N,N-diarylcarbamoyloxy groups, N-alkyl-N-arylcarbamoyloxy groups, alkylsulfoxy groups, arylsulfoxy groups, acylthio groups, acylamino groups, N-alkylacylamino groups, N-arylacylamino groups, ureido groups, N'-alkylureido groups, N',N'-dialkylureido groups, N'-arylureido groups, N',N'-diarylureido groups, N'-alkyl-N'-arylureido groups, N-alkylureido groups, N-arylureido groups, N'-alkyl-N-alkylureido groups, N'-alkyl-N-arylureido groups, N',N'-dialkyl-N-alkylureido groups, N',N'-dialkyl-N-arylureido groups, N'-aryl-N-alkylureido groups, N'-aryl-N-arylureido groups, N',N'-diaryl-N-alkylureido groups, N',N'-diaryl-N-arylureido groups, N'-alkyl-N'-aryl-N-alkylureido groups, N'-alkyl-N-aryl-N-arylureido groups, alkoxycarbonylamino groups, aryloxycarbonylamino groups, N-alkyl-N-alkoxycarbonylamino groups, N-alkyl-N-aryloxycarbonylamino groups, N-aryl-N-alkoxycarbonylamino groups, N-aryl-N-aryloxycarbonylamino groups, a formyl group, acyl groups, carboxyl groups and conjugated base groups, alkoxycarbonyl groups, aryloxycarbonyl groups, carbamoyl groups, N-alkylcarbamoyl groups, N,N-dialkylcarbamoyl groups, N-arylcarbamoyl groups, N,N-diarylcarbamoyl groups, N-alkyl-N-arylcarbamoyl groups, alkylsulfinyl groups, arylsulfinyl groups, alkylsulfonyl groups, arylsulfonyl groups, a sulfo group (—SO$_3$H) and conjugated base groups, alkoxysulfonyl groups, aryloxysulfonyl groups, sulfinamoyl groups, N-alkylsulfinamoyl groups, N,N-dialkylsulfinamoyl groups, N-arylsulfinamoyl groups, N,N-diarylsulfinamoyl groups, N-alkyl-N-arylsulfinanoyl groups, sulfamoyl groups, N-alkylsulfamoyl groups, N,N-dialkylsulfamoyl groups, N-arylsulfamoyl groups, N,N-diarylsulfamoyl groups, N-alkyl-N-arylsulfamoyl groups, N-acylsulfamoyl groups and conjugated base groups, N-alkylsulfonylsulfamoyl groups [—SO$_2$NHSO$_2$(alkyl)] and conjugated base groups, N-arylsulfonylsulfamoyl groups [—SO$_2$NHSO$_2$(aryl)] and conjugated base groups, N-alkylsulfonylcarbamoyl groups [—CONHSO$_2$(alkyl)] and conjugated base groups, N-arylsulfonylcarbamoyl groups [—CONHSO$_2$(aryl)] and conjugated base groups, alkoxysilyl groups [—Si(Oalkyl)$_3$], aryloxysilyl groups [—Si(Oaryl)$_3$], a hydroxysilyl group [—Si(OH)$_3$] and conjugated base groups, a phosphono group [—PO$_3$H$_2$] and conjugated base groups, dialkylphosphono groups [—PO$_3$(alkyl)$_2$], diarylphosphono groups [—PO$_3$(aryl)$_2$], alkylarylphosphono group [—PO$_3$(alkyl)(aryl)], monoalkylphosphono groups [—PO$_3$H(alkyl)] and conjugated base groups, monoarylphosphono groups [—PO$_3$H(aryl)] and conjugated base groups, a phosphonooxy group (—OPO$_3$H$_2$) and conjugated base groups, dialkylphosphonooxy groups [—OPO$_3$(alkyl)$_2$], diarylphosphonooxy groups [—OPO$_3$(aryl)$_2$], alkylarylphosphonooxy groups [—OPO$_3$(alkyl)(aryl)], monoalkylphosphonooxy groups [—OPO$_3$H(alkyl)] and conjugated base groups, monoarylphosphonooxy groups [—OPO$_3$H(aryl)] and conjugated base groups, a cyano group, a nitro group, dialkylboryl groups [—B(alkyl)$_2$], diarylboryl groups [—B(aryl)$_2$], alkylarylboryl groups [—B(alkyl)(aryl)], a dihydroxyboryl group [—B(OH)$_2$] and conjugated base groups, alkylhydroxyboryl groups [—B(alkyl)(OH)] and conjugated base groups, arylhydroxyboryl groups [—B(aryl)(OH)] and conjugated base groups, aryl groups, alkenyl groups, and alkynyl groups.

In the planographic printing plate precursor used in the invention, a substituent having a hydrogen atom which substituent can form a hydrogen bond, particularly a substituent having an acidic group that has an acid dissociation constant (pKa) smaller than that of a carboxylic acid is not preferable, since it tends to decrease printing durability. However, this substituent may be used depending on the design of a photosensitive layer. On the other hand, halogen atoms, hydrophobic substituents such as hydrocarbon groups (alkyl groups, aryl groups, alkenyl groups, and alkynyl groups), alkoxy groups, and aryloxyl groups are preferable, since they tend to improve printing durability. In particular, if the cyclic structure is a monocyclic aliphatic hydrocarbon having six or less members such as cyclopentane or cyclohexane, $R^2$ preferably has such a hydrophobic substituent. Two or more of these substituents may bind to each other or to a substituted hydrocarbon group to form a ring, and may have additionally a substituent thereon.

When A in Formula (i) is NR$^3$—, $R^3$ represents a hydrogen atom or a monovalent hydrocarbon group having 1 to 10 carbon atoms. Examples of the monovalent hydrocarbon groups having 1 to 10 carbon atoms represented by $R^3$ include alkyl groups, aryl groups, alkenyl groups, and alkynyl groups.

Specific examples of the alkyl groups include linear, branched, or cyclic alkyl groups having 1 to 10 carbon atoms such as a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamantyl group, and a 2-norbornyl group. Specific examples of the aryl group include aryl groups having 6 to 10 carbon atoms such as a phenyl group, a naphthyl group, and an indenyl group; and heteroaryl groups having 5 to 10 carbon atoms and containing a hetero atom selected from the group consisting of a nitrogen atom, an oxygen atom and a sulfur atom such as a furyl group, a thienyl group, a pyrrolyl group, a pyridyl group, and a quinolyl group.

Specific examples of the alkenyl group include linear, branched, or cyclic alkenyl groups having 2 to 10 carbon atoms such as a vinyl group, a 1-propenyl group, a 1-butenyl group, a 1-methyl-1-propenyl group, a 1-cyclopentenyl group, and a 1-cyclohexenyl group. Specific examples of the alkynyl group include alkynyl groups having 2 to 10 carbons such as an ethynyl group, a 1-propynyl group, a 1-butynyl group, and a 1-octynyl group. The substituent(s) which $R^3$ may have is the same as those which $R^2$ may have. The number of carbon atoms of $R^3$ is 1 to 10, including the carbon atoms of the substituent(s).

A in Formula (i) is preferably an oxygen atom or —NH—, since such a compound can be easily synthesized.

In Formula (i), n is an integer of 1 to 5, and preferably is 1 from the viewpoint of printing durability.

Specific examples of the repeating unit represented by Formula (i) are shown below, but the invention is not limited by these examples.

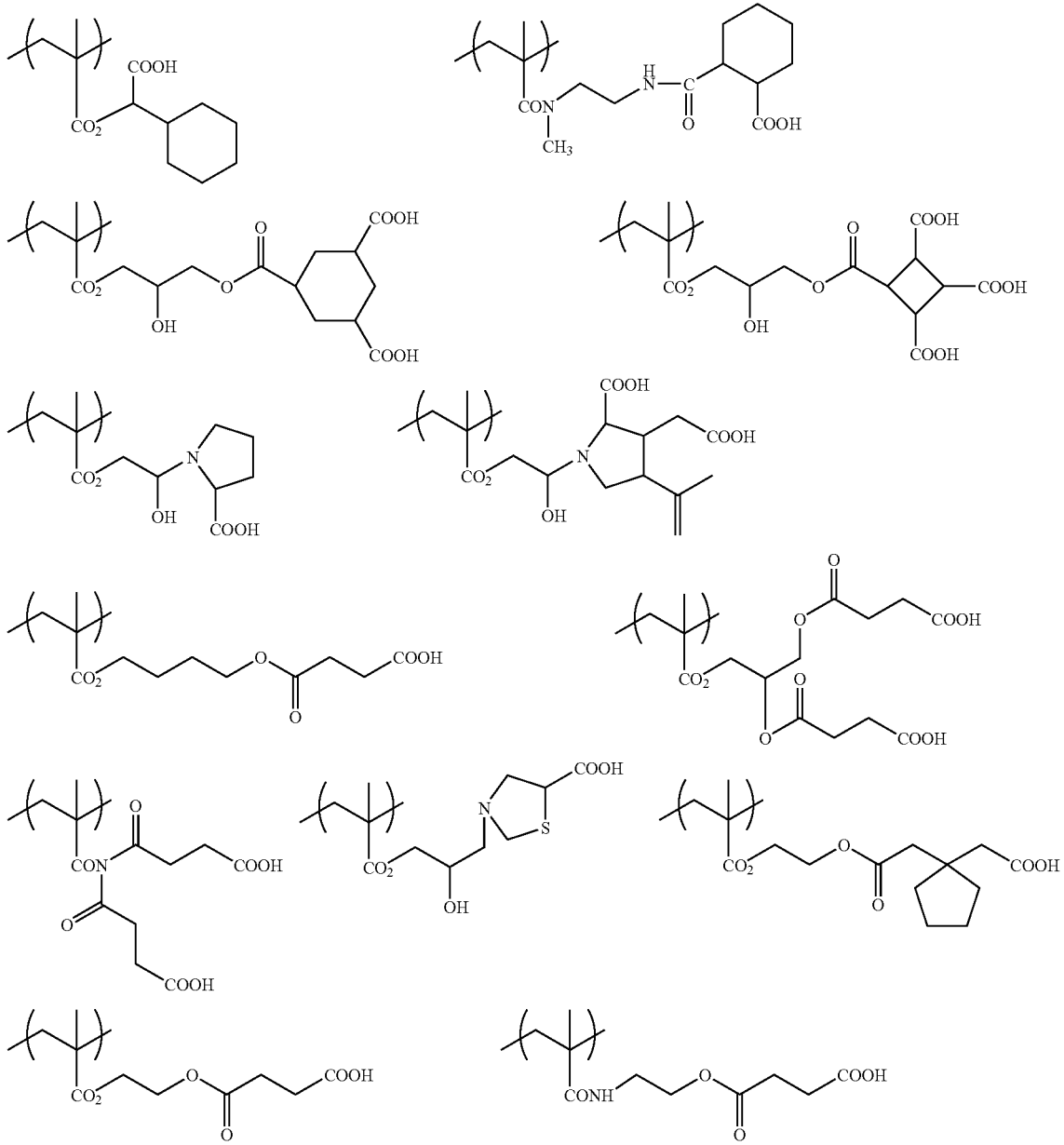

-continued
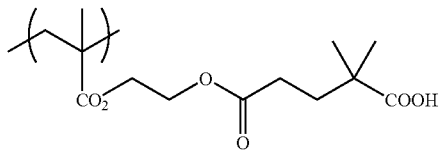
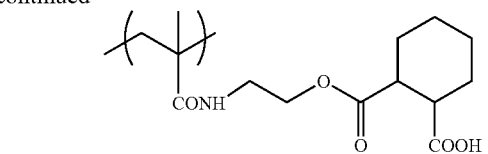
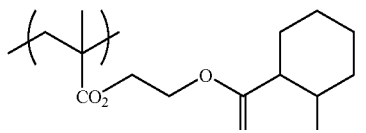
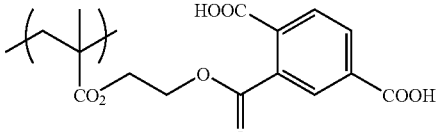
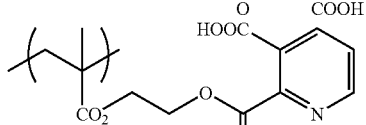
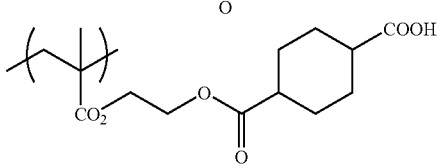
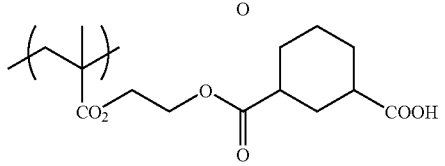
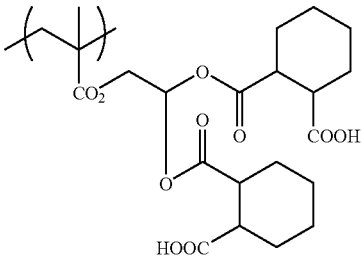
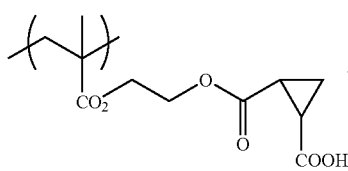
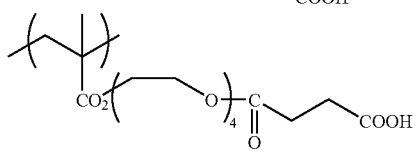
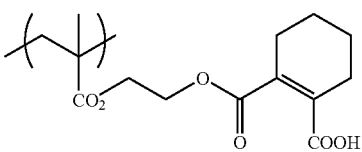
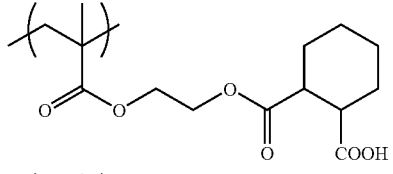
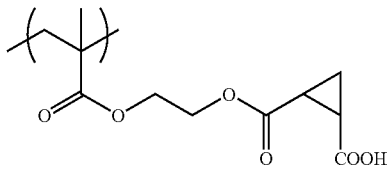
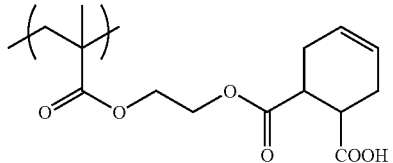
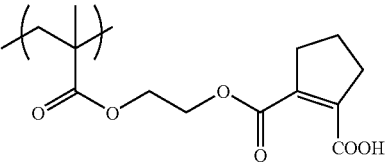
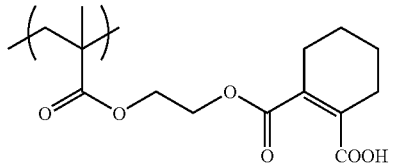
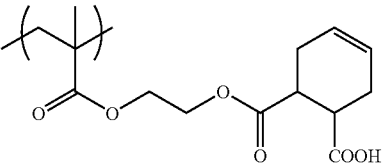
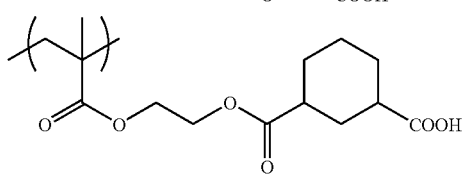
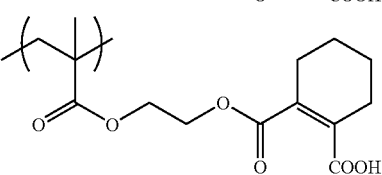

-continued
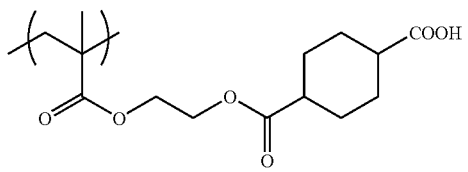
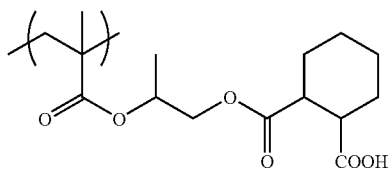
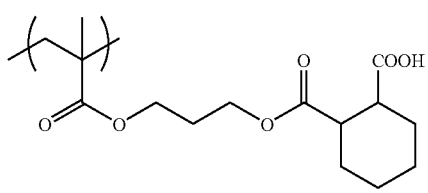
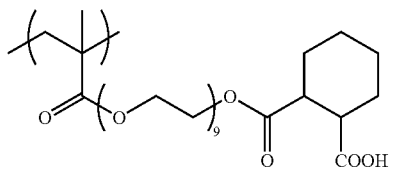
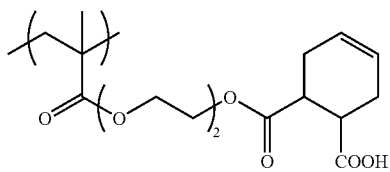
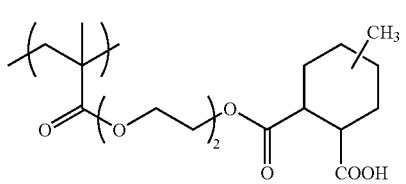
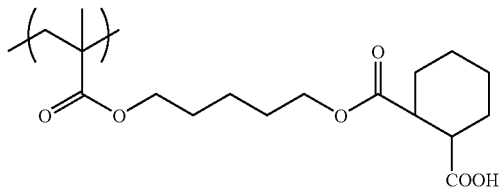
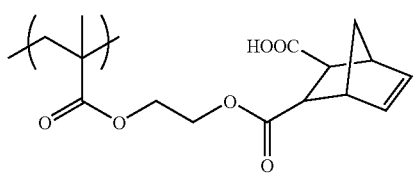
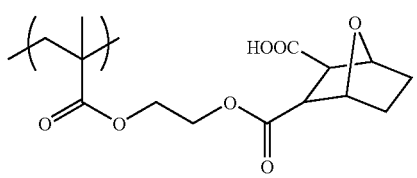
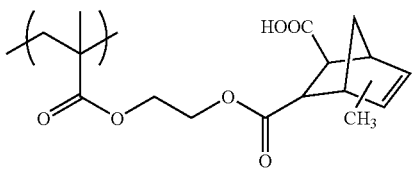
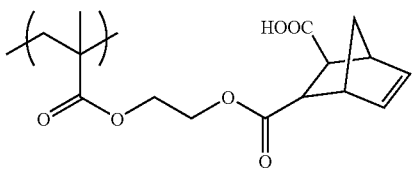
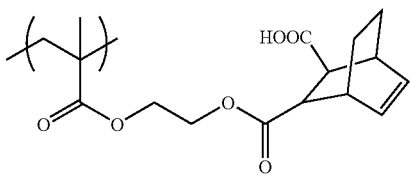
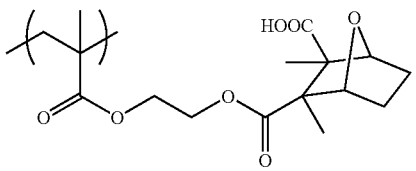
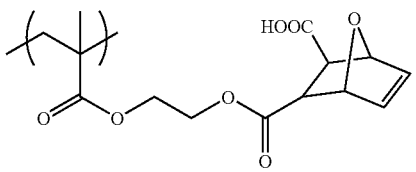
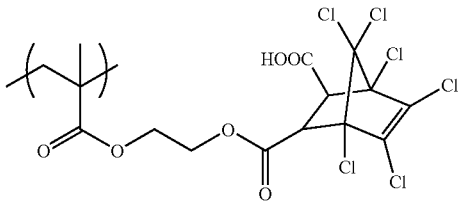
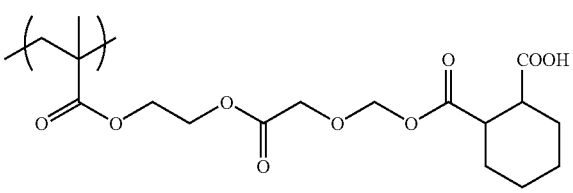
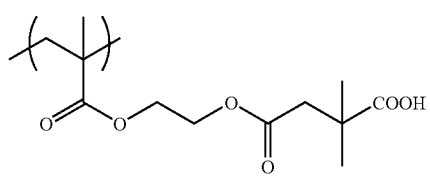
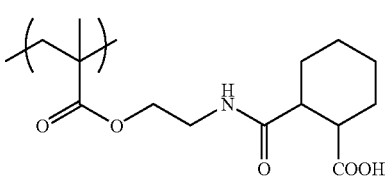

-continued
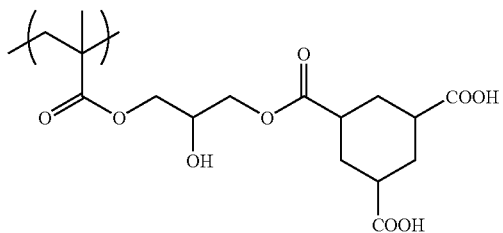
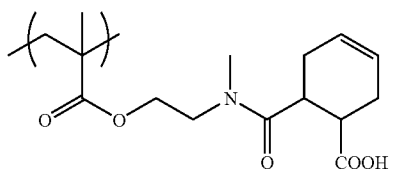
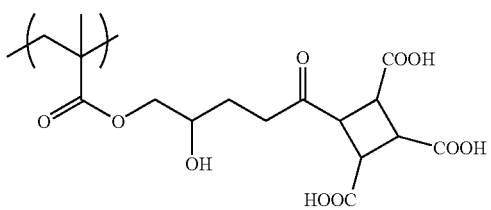
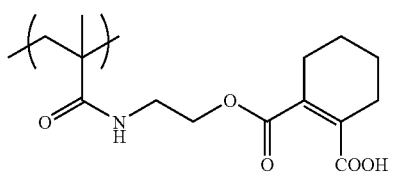
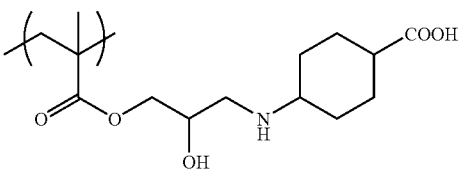
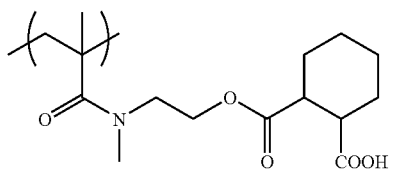
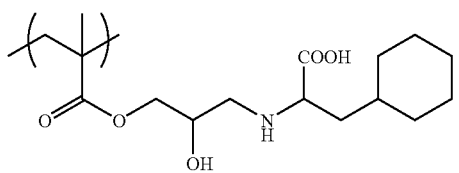
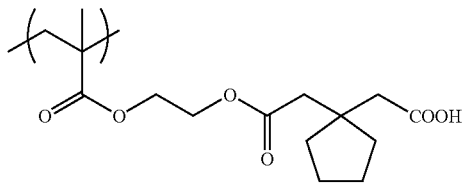
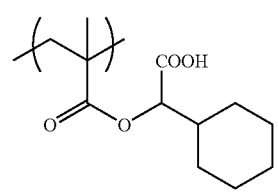
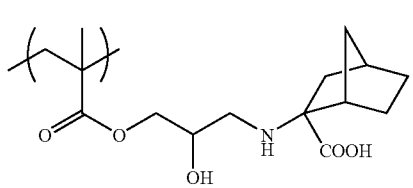
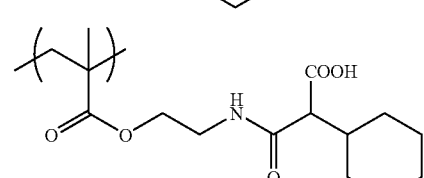
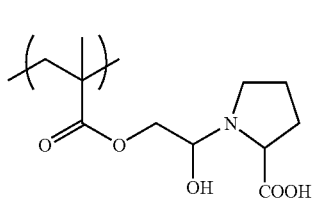
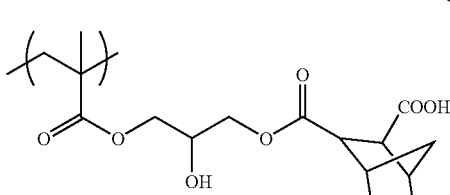
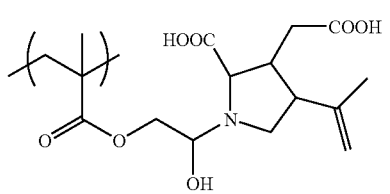
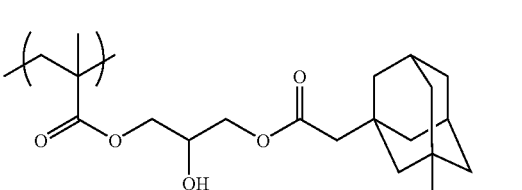

-continued
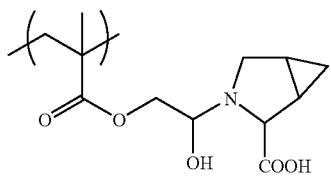
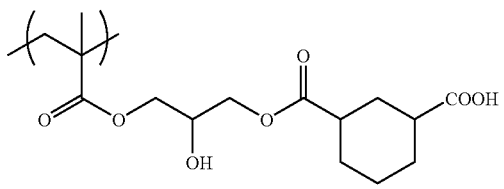
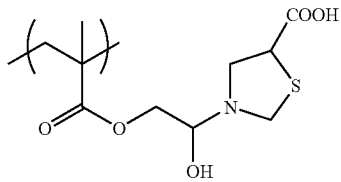
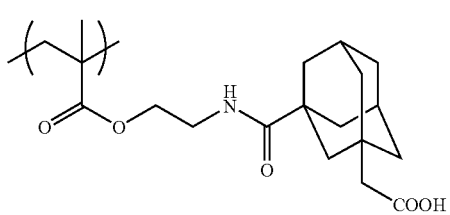
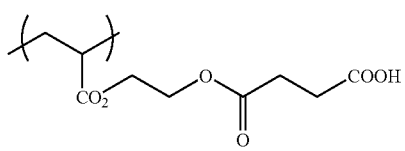
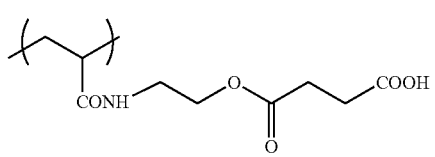
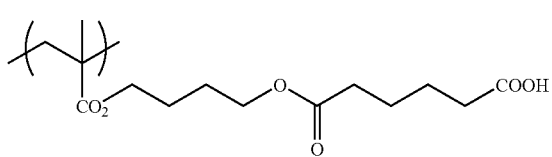
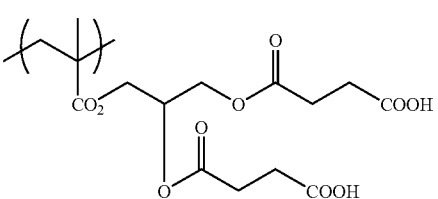
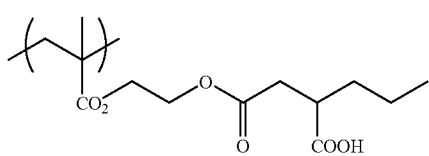
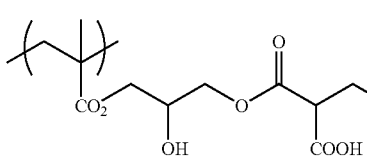
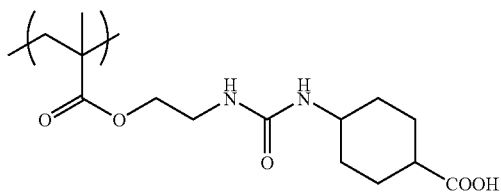
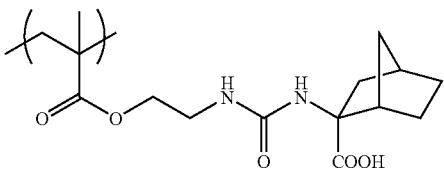
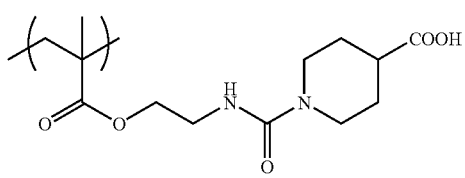
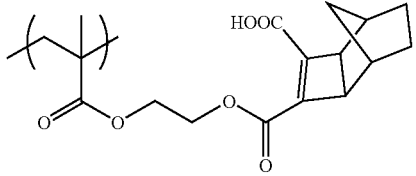
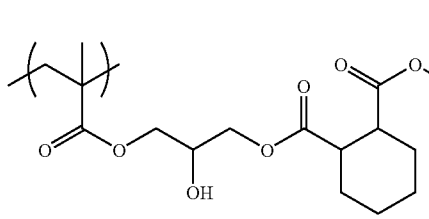
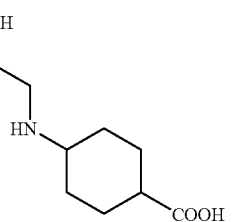

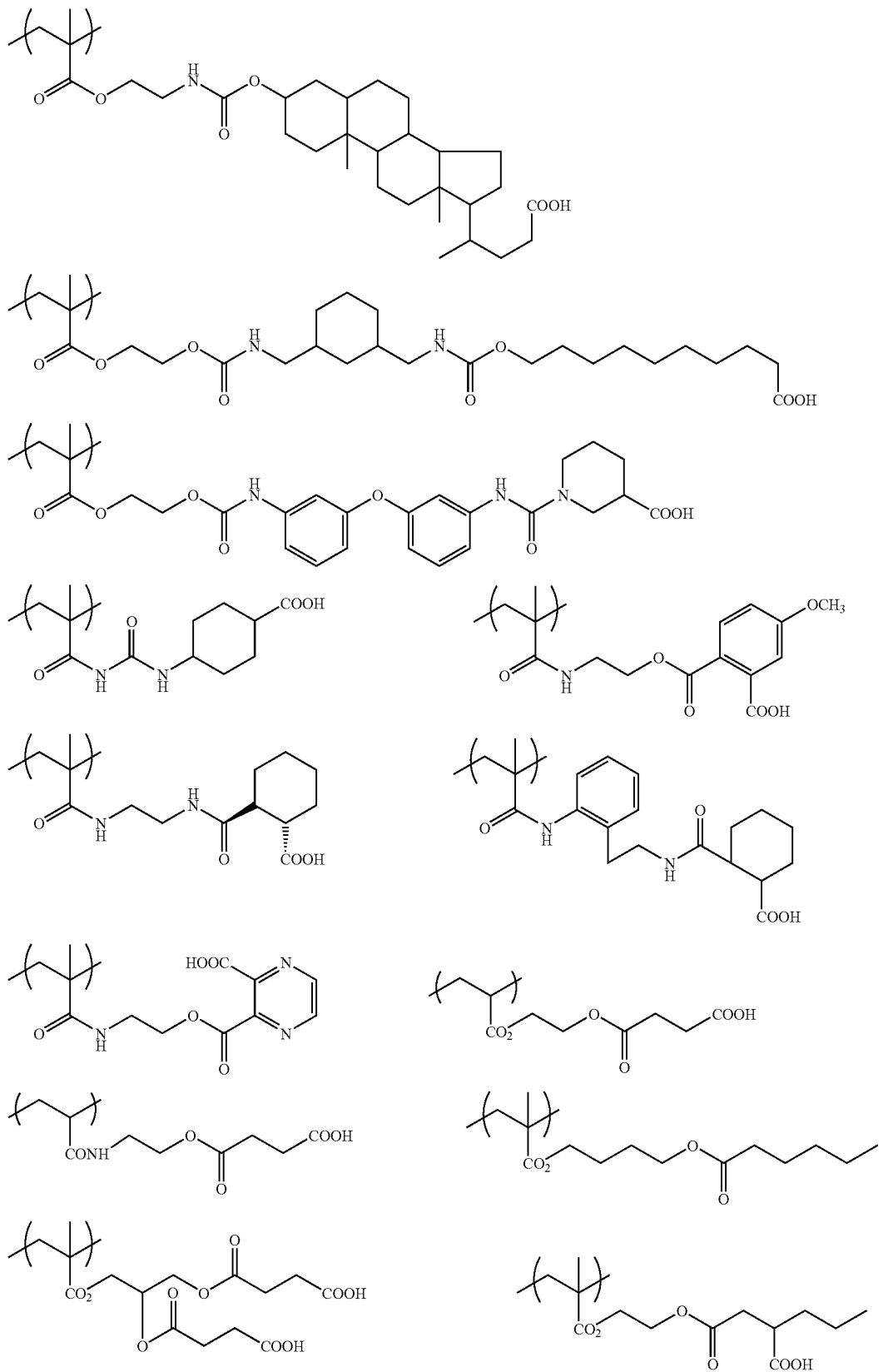

-continued

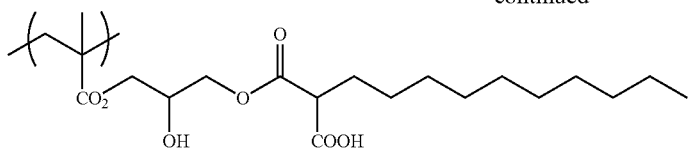

The binder polymer may have one or more of the repeating units represented by Formula (i). The particular binder polymer used in the invention may be a polymer consisting only of the repeating unit(s) represented by Formula (i), but is usually a copolymer in which at least one repeating unit described above is copolymerized with one or more other copolymerizable components. The content of the repeating unit(s) represented by Formula (i) in the copolymer may be determined suitably according to the structure of the copolymer and the design of a photosensitive layer composition, but is preferably in the range of 1 to 99 mole %, more preferably 5 to 40 mole %, and still more preferably 5 to 20 mole % with respect to the total number of moles.

Any known radical polymerizable monomer may be used as the copolymerizable component without restriction. Specific examples thereof include those described in "Polymer Data Handbook—Basic—(edited by Soc. Polymer Science, Japan, and published by Baihukan in 1986)". One copolymerizable component may be used alone, or two or more copolymerizable components can be used together.

The molecular weight of the particular binder polymer used in the invention is determined suitably according to a desired image-forming property and printing durability. The molecular weight is preferably in the range of 2,000 to 1,000,000, more preferably 5,000 to 500,000, and still more preferably 10,000 to 200,000.

The binder polymer used in the invention may be one particular binder polymer or a mixture of at least one particular binder polymer and one or more other binder polymers. Other binder polymer(s) is contained in an amount in the range of 1 to 60% by mass, preferably 1 to 40% by mass, and still more preferably 1 to 20% by mass with respect to the total weight of the binder polymer(s). Any known polymer may be used as other binder polymer without restriction, and specific examples thereof include binders having an acrylic main chain and urethane binders, which are commonly used in the art.

The total amount of the particular binder polymer(s) and other binder polymer(s) in the photosensitive layer composition may be determined suitably, but is generally in the range of 10 to 90%, preferably 20 to 80%, and still more preferably 30 to 70% by mass with respect to the total mass of the nonvolatile components of the photosensitive layer composition.

The acid value (meg/g) of the binder polymer is preferably in the range of 2.00 to 3.60.

Other Binder Polymer Used Together with Particular Binder Polymer

Other binder polymer used together with particular binder polymer is preferably a binder polymer having a group which can be polymerized with a free radical (radically polymerizable group).

The radically polymerizable group is not particularly limited, as long as it can be polymerized by a free radical. Examples thereof include α-substituted methylacrylic groups [—OC(=O)—C(—CH$_2$Z)=CH$_2$] wherein Z is a hydrocarbon group having a hetero atom bonded to the CH$_2$ group, an acrylic group, a methacrylic group, an allyl group, and a styryl group. The radically polymerizable group is preferably an acrylic group and/or a methacrylic group.

The content of the radical polymerizable group in the binder polymer (content of radically polymerizable unsaturated double bond determined by iodimetry) is preferably 0.1 to 10.0 mmol, more preferably 1.0 to 7.0 mmol, and most preferably 2.0 to 5.5 mmol per g of the binder polymer from the viewpoints of sensitivity and storage stability.

In addition, other binder polymer preferably has an alkali-soluble group. The content of the alkali-soluble group in the binder polymer (acid value determined by neutralization titration) is preferably 0.1 to 3.0 mmol, more preferably 0.2 to 2.0 mmol, and most preferably 0.45 to 1.0 mmol per g of the binder polymer from the viewpoints of precipitating property of development scum and printing durability.

The weight-average molecular weight of the binder polymer is preferably in the range of 2,000 to 1,000,000, more preferably 10,000 to 300,000, and most preferably 20,000 to 200,000 from the viewpoints of film-forming property (printing durability) and solubility thereof in a coating solvent.

The glass transition temperature (Tg) of the binder polymer is preferably in the range of 70 to 300° C., more preferably 80 to 250° C., and most preferably 90 to 200° C. from the viewpoints of storage stability, printing durability, and sensitivity.

The binder polymer preferably has an amide group or an imide group in the molecule, especially a methacrylamide or methacrylamide derivative to raise the glass transition temperature of the binder polymer.

Other Components

The photosensitive layer of the planographic printing plate precursor used in the invention may contain, in addition to the primary components described above, other components suitable for application, and the production method thereof. Hereinafter, examples of additives which the photosensitive layer may have will be described.

Coloring Agent

The photosensitive layer of the planographic printing plate precursor used in the invention may contain a dye or a pigment for the purpose of coloration thereof. A colored photosensitive layer can improve so-called plate-inspection properties such as visibility of images formed on the printing plate and adaptability of the plate to an image densitometer. Specific examples of the coloring agent include pigments such as phthalocyanine pigments, azo pigments, carbon black, and titanium oxide; dyes such as ethyl violet, crystal violet, azo dyes, anthraquinone dyes, and cyanine dyes. Among them, the coloring agent is preferably a cationic dye.

The amount of the dye(s) and/or pigment(s) added as the coloring agent(s) is preferably about 0.5 to 5% by mass with respect to the total amount of the nonvolatile components of the photosensitive layer composition.

Polymerization Inhibitor

The photosensitive layer of the planographic printing plate precursor used in the invention preferably contains a compound having a polymerizable ethylenic unsaturated double bond, i.e., a thermal polymerization inhibitor in a small amount for prevention of undesirable thermal polymerization of the polymerizable compound. Specific examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and a cerium(I) salt of N-nitrosophenylhydroxyamine. The amount of the thermal polymerization inhibitor added is preferably about 0.01 to about 5% by mass with respect to the mass of the nonvolatile components of the photosensitive layer composition. In addition, in order to prevent oxygen from inhibiting polymerization, the photosensitive layer may contain a higher fatty acid derivative such as behenic acid or behenic acid amide, if necessary. Such a compound may be localized in the surface portion of the layer during the applied layer is dried. The amount of the higher fatty acid derivative added is preferably about 0.5 to about 10% by mass with respect to the nonvolatile components of the photosensitive layer composition.

Other Additives

In addition, the photosensitive layer of the planographic printing plate precursor used in the invention may contain other additives known in the art, including an inorganic filler and a plasticizer to improve physical properties of a cured film and a sensitizing agent to improve ink-receiving property of the photosensitive layer surface. Examples of the plasticizer include dioctyl phthalate, didodecyl phthalate, triethylene glycol dicaprylate, dimethylglycol phthalate, tricresyl phosphate, dioctyl adipate, dibutyl sebacate, and triacetylglycerin. The plasticizer can be added generally in an amount of 10% by mass or less with respect to the total mass of the binder polymer(s) and the addition-polymerizable compound(s).

The photosensitive layer of the planographic printing plate precursor used in the invention may also contain an UV initiator, and/or a heat cross-linking agent for the purpose of enhancing the effects of heating and exposure after development and in turn improving film strength (printing durability) described later.

Support

Any known support used in planographic printing plate precursors may be used in the invention without restriction.

The support is preferably a plate-shaped substrate having dimensional stability, and examples thereof include paper; paper on which a plastic resin (e.g., polyethylene, polypropylene, and polystyrene) is laminated; metal plates (e.g., aluminum, zinc, and copper plates); plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinylacetal films); and paper and plastic films on which the above-described metal is laminated or deposited. The surface of the support may be processed physically and/or chemically by a known method or methods for improvement in hydrophilicity and strength, if necessary.

Specific preferable example of the support include paper, a polyester film and an aluminum plate. Among them, the support is particularly preferably an aluminum plate, which is superior in dimensional stability, relatively inexpensive, and can provide a surface having good hydrophilicity and sufficient strength by surface treatment, which is conducted as needed. In addition, specific preferable examples thereof further include a composite sheet in which an aluminum sheet is bonded to a polyethylene terephthalate film and which is described in JP-B No. 48-18327.

The aluminum plate which is most suitable as the support in the invention is a metal plate containing aluminum as the main component thereof, which has dimensional stability, and is selected from a pure aluminum plate, metal plates containing as the main component thereof aluminum, and containing a trace amount of other element(s), and plastic films and paper on which aluminum or an aluminum alloy is laminated or vapor-deposited. As described above, the generic term "aluminum support" is used for supports containing aluminum or an aluminum alloy. Examples of the elements other than aluminum contained in the aluminum alloy include silicon, iron, manganese, copper, magnesium, chromium, zinc, bismuth, nickel, and titanium, and the content thereof in the alloy is 10% by mass or less. Although the support is most preferably a pure aluminum support in the invention, the aluminum plate may contain a trace amount of other element(s). This is because it is difficult to prepare completely pure aluminum from the viewpoint of refining techniques. As described above, the composition of the aluminum plate to be used in the invention is not particularly specified, and any one of aluminum plates known and used in the art, for example, those stipulated in JIS A1050 (commonly-known aluminum material that consists of 99.5% by mass or more of Al), A1100 (commonly-known aluminum material that consists of 99.0% by mass or more of Al) or the like may be used arbitrarily in the invention.

The thickness of the aluminum support for use in the invention is about 0.1 mm to 0.6 mm. The thickness may be suitably changed according to the size of a printing machine, the dimension of a desired printing plate, and/or needs of user.

The aluminum support may be subjected to surface treatment described below.

Surface Roughening Treatment

Examples of a surface roughening method include mechanical surface roughening, chemical etching, and electrolytic graining disclosed in JP-A No. 56-28893. In addition, a mechanical surface roughening method such as an electrochemical surface roughening method of electrochemically roughening an aluminum support surface in a hydrochloric or nitric acid electrolyte, a wire brush graining method of scratching an aluminum support surface with metal wires, a ball graining method of roughening an aluminum support surface with abrasive balls and an abrasive; or a brush graining method of roughening an aluminum support surface with a nylon brush and an abrasive can be conducted as the surface roughening method. One of these surface roughening methods may be conducted, or two or more of them can be conducted. Among the surface roughening methods described above, preferable is the electrochemical method of chemically roughening an aluminum support surface in a hydrochloric or nitric acid electrolyte, and the amount of anodic electric current (current when the support serves as a positive electrode) is preferably in the range of 50 to 400 C/dm². More specifically, the alternate current and/or direct current electrolysis is preferably carried out in an electrolyte containing 0.1 to 50% of hydrochloric or nitric acid at a temperature of 20 to 80° C. at an electric current density of 100 to 400 C/dm² for a period of 1 second to 30 minutes.

The aluminum support subjected to the surface roughening treatment may be further chemically etched in an acid or alkali. Specific examples of the etching agent include sodium hydroxide, sodium carbonate, sodium aluminate, sodium metasilicate, sodium phosphate, potassium hydroxide, and lithium hydroxide. The concentration and the temperature are preferably 1 to 50%, and 20 to 100° C., respectively. After etching, the support is washed with an acid to remove stains remaining on the support surface (smuts). The acid is preferably nitric acid, sulfuric acid, phosphoric acid, chromic acid, hydrofluoric acid, and/or borofluoric acid. In particular, a method for removing smuts after electrochemical surface roughening treatment is preferably a method described in JP-A No. 53-12739 wherein the support surface is brought into contact with 15 to 65% by mass of sulfuric acid at a temperature of 50 to 90° C., and/or a method described in JP-B 48-28123 wherein the surface is alkaline-etched. The method for removing smuts and conditions therefore are not particularly limited, as long as the surface roughness of the treated surface Ra is about 0.2 to 0.5 μm.

Anodizing Process

The aluminum support on which an oxide layer is formed in the above manner are subjected to anodizing treatment.

In the anodizing treatment, One or at least two of aqueous solutions of sulfuric acid, phosphoric acid, oxalic acid, and boric acid/sodium borate are used as the main component(s) of the electrolytic solution contained in an electrolytic bath. The electrolyte solution may contain other components commonly contained in the aluminum alloy plate, the electrodes, tap water, and underground water. In addition, the electrolyte solution may also contain second and third components. Examples of the second and third components include cations including metal ions such as Na, K, Mg, Li, Ca, Ti, Al, V, Cr, Mn, Fe, Co, Ni, Cu, and Zn, and an ammonium ion; and anions such as nitrate, carbonate, chloride, phosphate, fluoride, sulfite, titanate, silicate, and borate ions. The concentration thereof in the electrolyte solution may be about 0 to 10,000 ppm. Conditions of the anodizing treatment are not particularly limited, but the support is preferably subjected to direct or alternate current electrolysis at 30 to 500 g/L at a processing solution temperature of 10 to 70° C. at an electric current density of 0.1 to 40 A/m$^2$. The thickness of the anodic oxidation film formed is in the range of 0.5 to 1.5 μm, and preferably in the range of 0.5 to 1.0 μm. Conditions of the anodic oxidation are preferably selected so that the diameter and density of micropores present in the anodic oxidation film of the support prepared as described above respectively become 5 to 10 nm and $8 \times 10^{15}$ to $2 \times 10^{16}$ pores/m$^2$.

Any hydrophilization method known in the art may be used in making the support surface hydrophilic. Particularly preferable examples include a hydrophilization treatment using silicate or polyvinyl phosphonic acid. The film is formed such that the amount of silicon or phosphor element is preferably 2 to 40 mg/m$^2$, and more preferably 4 to 30 mg/m$^2$. The coating amount can be measured in accordance with a fluorescent X-ray analytic method.

The hydrophilization treatment can be carried out, for example, by immersing an aluminum support on which an anodic oxidation film is formed in an aqueous solution containing an alkali metal silicate or polyvinylphosphonic acid at a concentration of 1 to 30%, and preferably 2 to 15% by mass, and having a pH at 25° C. in the range of 10 to 13 at a temperature of 15 to 80° C. for a period of 0.5 to 120 seconds.

The alkali metal silicate used in the hydrophilization treatment can be sodium silicate, potassium silicate, and/or lithium silicate. The hydroxide used to raise the pH of the aqueous alkali metal silicate solution can be sodium hydroxide, potassium hydroxide, and/or lithium hydroxide. The processing solution may contain an alkaline earth metal salt and/or a salt of a metal of Group IVB. Examples of the alkaline earth metal salt include water-soluble salts including nitric acid salts such as calcium nitrate, strontium nitrate, magnesium nitrate, and barium nitrate, sulfates, hydrochlorates, phosphates, acetates, oxalates, and borates. Examples of the salt of the metal of the Group IVB include titanium tetrachloride, titanium trichloride, titanium potassium fluoride, titanium potassium oxalate, titanium sulfate, titanium tetraiodide, zirconium oxychloride, zirconium dioxide, zirconium oxychloride, and zirconium tetrachloride.

One of the alkaline earth metal salts and Group IVB metal salts may be used, or two or more of them can be used together. The content of the metal salt(s) is preferably in the range of 0.01 to 10% and more preferably in the range of 0.05 to 5.0% by mass. Alternatively, silicate electrodeposition described in U.S. Pat. No. 3,658,662 is also effective. Further, a combination of a substrate subjected to electrolytic graining as disclosed in JP-B No. 46-27481, and JP-A Nos. 52-58602 or 52-30503 and the above-described anodizing treatment and the hydrophilization treatment is also useful as surface treatment.

Production of Planographic Printing Plate Precursor

The planographic printing plate precursor of the invention has a support and a photosensitive layer and a protective layer formed on or above the support in this order, and optionally has any other layer such as an undercoat layer. The planographic printing plate precursor is produced by dissolving the various components described above in at least one suitable solvent to form coating solutions and applying the resulting solutions onto a support.

The photosensitive layer is formed by dissolving the components thereof in an organic solvent to form a photosensitive layer coating solution and applying the coating solution to a support or an undercoat layer.

Examples of the solvent used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butylolactone, methyl lactate, and ethyl lactate. One of these solvents may be used alone, or two or more of them can be used together. The concentration of the solid matter in the photosensitive layer coating solution is generally 2 to 50% by mass.

The coating amount of the photosensitive layer, which can mainly influence sensitivity and developing property of the photosensitive layer, and strength and printing durability of the exposed layer, may be selected suitably according to applications. It the coating amount is too small, printing durability becomes insufficient. On the contrary, if it is too large, sensitivity decreases, and consequently exposure and development respectively take longer time. In the case of a planographic printing plate precursor for scanning exposure, the amount of the photosensitive layer is preferably in the range of about 0.1 to about 10 g/m$^2$ and more preferably 0.5 to 5 g/m$^2$ in terms of dry mass.

Physical Properties of Photosensitive Layer

In regard to the physical properties of the photosensitive layer, the developing speed of unexposed portions in an alkaline developing solution having a pH of 10 to 13.5 is preferably 80 nm/sec or more, and the permeation speed of the alkaline developing solution into exposed portions is preferably 50 nF/sec or less.

Here, the developing speed of unexposed portions in an alkaline developing solution having a pH of 10 to 13.5 is a value obtained by dividing the thickness (nm) of a photosensitive layer by a time which development required (sec). The permeation speed of the alkaline developing solution in exposed portions is a value showing a rate of change in electrostatic capacitance (F) when the photosensitive layer is formed on a conductive support and the support is immersed in a developing solution.

Hereinafter, a method for measuring the "developing speed of unexposed portions in an alkaline developing solution" and the "permeation speed of the alkaline developing solution in exposed portions" in the invention will be described in detail.

Measurement of Developing Speed of Exposed Portions in Alkaline Developing Solution The developing speed of unexposed portions in an alkaline developing solution is a value obtained by dividing the thickness (nm) of a photosensitive layer by a time which development required (sec).

In measuring the developing speed in the invention, an unexposed photosensitive layer formed on an aluminum support is immersed in an alkaline developing solution (30° C.) having a pH in the range of 10 to 13.5, and the dissolving behavior of the photosensitive layer is checked with a DRM interference wave-measuring instrument as shown in FIG. 1. FIG. 1 is a schematic view of the DRM interference wave-measuring instrument used in determining the dissolving behavior of a photosensitive layer. In the invention, a change in film thickness is detected by using the interference caused by light having a wavelength of 640 nm. When development does not cause swelling of the negative photosensitive layer and dissolution of the negative photosensitive layer starts with dissolution of the surface thereof, the layer gradually thins with the passage of developing time, and an interference wave corresponding to a film thickness is obtained. Alternatively, when development causes swelling of the negative photosensitive layer and the swollen layer separates from a support in the form of masses, penetration of the developing solution in the layer causes the layer to thicken due to swelling thereof and thin due to separation thereof from the support, and thus a distinct interference wave cannot be obtained.

Measurement is continued under these conditions until the photosensitive layer is completely removed. The developing speed is obtained according to the following equation on the basis of a time necessary to completely remove the photosensitive layer and to thereby decrease the layer thickness to 0 (development completion time) (second) and the initial thickness of the photosensitive layer (nm). A high developing speed means that a layer is readily removed with a developing solution and that the development property of the layer is good.

> Developing speed (at unexposed portions)=Initial thickness of photosensitive layer (nm)/Development completion time (second)

Measurement of Permeation Speed of Alkaline Developing Solution in Exposed Portions As described above, the permeation speed of an alkaline developing solution in exposed portions refers to a speed of change in electrostatic capacitance (nF) when a photosensitive layer is formed on a conductive support and the support is immersed in a developing solution.

Figure 2:
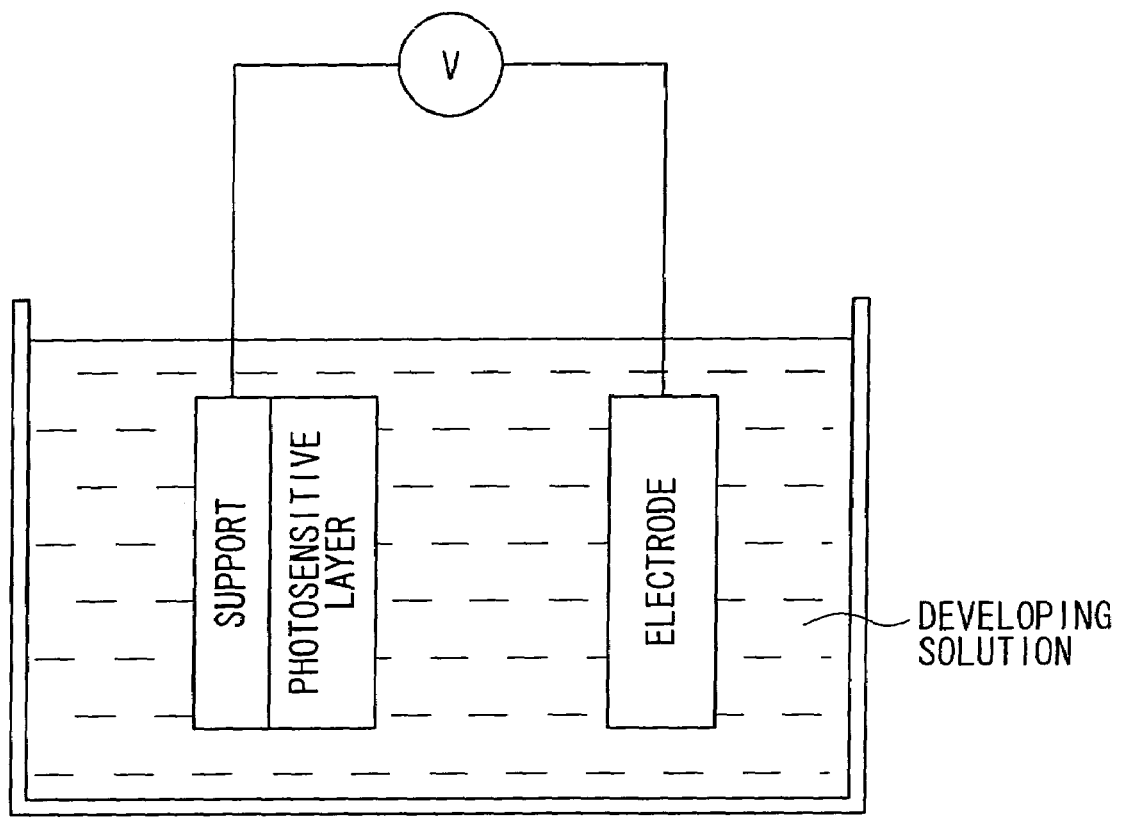
FIG. 2 is a schematic diagram of a configuration of an example of a method of determining static electricity capacity, for use in evaluating permeability of a photosensitive layer (recording layer) to developing liquid.

In order to measure electrostatic capacity serving as an indicator of the permeability of the alkaline developing solution, the following method can be conducted. As shown in FIG. 2, an aluminum support having thereon a photosensitive layer is exposed to light at a predetermined light amount, and the support, which has the resultant cured photosensitive layer and serves as an electrode, is then immersed in an alkaline developing solution having a pH in the range of 10 to 13.5 and kept at 28° C. A conventional electrode serving as a counter electrode is also immersed in the alkaline developing solution and a wire or cable is connected to the electrode and the aluminum support. Then, an electrical voltage is applied to the resultant circuit and electrostatic capacitance is measured. After the application and measurement are started, the developing solution permeates in the photosensitive layer with the passage of time, and then reaches the interface between the support and the photosensitive layer. During this process, electrostatic capacity changes.

The permeation speed can be obtained according to the following equation on the basis of a time from a time when the measurement has started to a time when electrostatic capacity no longer changes (second) and the saturated electrostatic capacity of the photosensitive layer (nF). The lower the permeation speed, the lower the permeability of the developing solution.

> Permeation speed of developing solution (in exposed portions)=Saturated electrostatic capacity of photosensitive layer (nF)/time from a time when the measurement has started to a time when electrostatic capacity no longer changes (second)

As for the physical properties of the photosensitive layer of the planographic printing plate precursor of the invention, the developing speed of unexposed portions in an alkaline developing solution having a pH of 10 to 13.5 which developing speed is determined in the above manner is more preferably 80 to 400 nm/second and still more preferably 90 to 200 nm/second. On the other hand, the permeation speed of the alkaline developing solution at exposed portions is more preferably 0 to 50 nF/second and still more preferably 0 to 10 nF/second.

Any of methods commonly practiced in the art may be conducted to control the developing speed of unexposed portions of the photosensitive layer and the permeation speed of the alkaline developing solution into the cured photosensitive layer, or exposed portions. For example, in order to accelerate the developing speed of unexposed portions, it is effective that the photosensitive layer contains a hydrophilic compound. Moreover, in order to suppress penetration of the developing solution into exposed portions, it is effective that the photosensitive layer contains a hydrophobic compound.

In the invention, each of the developing speed of the photosensitive layer and the permeation speed of the developing solution can be easily adjusted to be in the above-described, preferable range by using the specific binder polymer previously described.

Intermediate Layer (Undercoat Layer)

The planographic printing plate precursor of the invention may have an intermediate layer (also referred to as an undercoat layer) for the purpose of improving adhesiveness between the photosensitive layer and the support and the staining property of the precursor. Specific examples of such an intermediate layer include those described in JP-B No. 50-7481, JP-A Nos. 54-72104, 59-101651, 60-149491, 60-232998, 3-56177, 4-282637, 5-16558, 5-246171, 7-159983, 7-314937, 8-202025, 8-320551, 9-34104, 9-236911, 9-269593, 10-69092, 10-115931, 10-161317, 10-260536, 10-282682 and 11-84674, and Japanese Patent Application Nos. 8-225335, 8-270098, 9-195863, 9-195864, 9-89646, 9-106068, 9-183834, 9-264311, 9-127232, 9-245419, 10-127602, 10-170202, 11-36377, 11-165861, 11-284091 and 2000-14697.

Plate Making Method

Hereinafter, the method of making a planographic printing plate (plate-making method) according to the invention will be described.

The method of making a planographic printing plate according to the invention preferably includes: exposing the planographic printing plate precursor described above to light having a wavelength of 750 nm to 1,400 nm; and developing the exposed planographic printing plate substantially without a heating treatment. The method of making a planographic printing plate according to the invention more preferably includes the exposing and the developing substantially without heating and washing treatments. In the invention, the conveying speed of the planographic printing plate during the development is preferably 1.25 m/min or more.

The photosensitive layer, to which the method of making a planographic printing plate according to the invention is applied, preferably has the following physical properties: the developing speed of unexposed portions in an alkaline developing solution having a pH of 10 to 13.5 being 80 nm/sec or more, and the permeation speed of the alkaline developing solution in exposed portions being 50 nF/sec or less. Control of the developing speed of unexposed portions of the photosensitive layer and the permeation rate of an alkaline developing solution in the cured photosensitive layer may be carried out according to ordinary methods. In addition to using the particularly binder polymer, addition of a hydrophilic compound, for example, is effective in accelerating the developing speed of unexposed portions, and addition of a hydrophobic compound is effective in suppressing the permeation of the developing solution into exposed portions.

Exposure

Any light having a wavelength of 750 to 1,400 nm may be used as a light source for exposure in the invention, and preferable examples thereof include an infrared laser. The planographic printing plate precursor according to the invention is preferably subjected to image exposure with a solid laser or semiconductor laser emitting an infrared light with a wavelength of 750 to 1,400 nm. The output of the laser is preferably 100 mW or more, and use of a multi-beam laser device is preferable for shortening exposure time. The exposure time per image pixel is preferably 20 μseconds or less. The energy of the laser applied to the planographic printing plate precursor is preferably 10 to 300 mJ/cm$^2$. If the exposure energy is too low, curing of the photosensitive layer does not proceed sufficiently. Alternatively, if the exposure energy is too high, the photosensitive layer may be damaged due to laser abrasion.

In the exposure in the invention, the light beams from a light source may be overlapped. The overlap means that a sub scanning pitch width is smaller than the diameter of a beam. For example, when a beam diameter is expressed by the full width at the half maximum intensity (FWHM), the degree of overlap can be expressed quantitatively by an overlapping coefficient, FWHM/sub scanning pitch width. In the invention, the overlapping coefficient is preferably 0.1 or more.

A method of scanning a planographic plate precursor with a light source of an exposure apparatus used in the invention is not particularly restricted, and the exposure may be carried out either by scanning the external or internal wall of a cylinder to which esternal or internal wall a printing plate precursor is attached, or the surface of a printing plate precursor disposed flat. The light source may be single-channel type or multi-channel type, but a multi-channel light source is preferably used for scanning the external surface of a cylinder to which external surface a printing plate precursor is attached.

In the invention, the planographic printing plate exposed is preferably developed without heating and washing treatments. This lack of heating treatment allows suppression of non-uniformity of images which is caused by heating treatment. In addition, lack of heating and washing treatments allows stable high-speed processing in development.

Development

In the development in the invention, a developing solution is used to remove non-image portions in the photosensitive layer.

As described above, the processing speed during development, i.e., the conveying speed of the planographic printing plate (line speed) during development, is preferably 1.25 m/min or more and still more preferably 1.35 m/min or more in the invention. The upper limit value of the conveying speed is not particularly limited, and it is preferably 3 m/min or less from the viewpoint of conveyance stability.

Developing Solution

The developing solution used in the invention is preferably an alkaline aqueous solution having a pH value of 14 or less, more preferably an alkaline aqueous solution containing at least one gelation-inhibiting agent selected from the group consisting of a monoalcohol and ketone compound and an anionic surfactant.

Monoalcohol Compounds and Monoketone Compounds

The monoalcohol compounds and monoketone compounds contained in the developing solution used in the invention are monofuctional compounds containing an alcohol or ketone in the molecule. The monoalcohol and ketone compounds in the invention preferably have a high-boiling point, since such compounds do not easily evaporate and are effective for a longer period of time. Use of such a compound allows suppression of gelation which is caused by the water-soluble polymer derived from a protective layer and dissolved in the developing solution.

Gel occurring in the developing solution usually deteriorates printing efficiency and generates stains in non-image portions, and results in clogging of tubing and spray tubes, demanding removal of the gel by replacing the treatment solution, and deteriorating operational efficiency. However, the plate-making method according to the invention prevents such gelation by using the monoalcohol compounds and monoketone compounds, thereby eliminates the labor for replacing a developing solution for an extended period of time and thus allows suppression of stains in non-image portions and of a lowering of operational efficiency.

Specific examples of the monoalcohol and ketone compounds used in the invention include n-propyl alcohol, iso-propyl alcohol, n-butyl alcohol, iso-butyl alcohol, sec-butyl alcohol, t-butyl alcohol, n-amyl alcohol, sec-amyl alcohol, t-amyl alcohol, cyclohexanol and derivatives thereof, phenoxyethanol and derivatives thereof, phenol and derivatives thereof, diethylketone, and cyclohexanone and derivatives thereof.

These compounds may be used singly or in combination of two or more of them. The content of the monoalcohol and/or monoketone compound in the developing solution is preferably 0.01 to 10%, more preferably 1 to 8%, and still more preferably 2 to 8% by mass.

In addition, the developing solution for use in the invention preferably contains an aromatic anionic surfactant in addition to the monoalcohol compound and/or monoketone compound.

Aromatic Anionic Surfactant

The aromatic anionic surfactant used in the developing solution used in the invention is effective in accelerating development and in dispersing and stabilizing the components of the engative-type polymerizable photosensitive layer and the protective layer in the developing solution, and thus in stabilizing the development. The aromatic anionic surfactant for use in the invention is preferably a compound represented by the following Formulae (A) or (B).

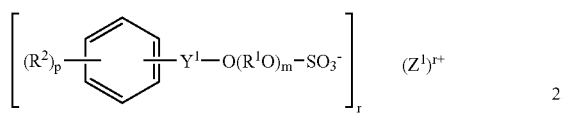

Formula (A)

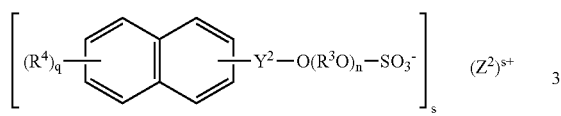

Formula (B)

In Formula (A) or (B), $R^1$ and $R^3$ each represent a linear or branched alkylene group having 1 to 5 carbon atoms, and specific examples thereof include an ethylene group, a propylene group, a butylene group, and a pentylene group. Each of $R^1$ and $R^3$ is preferably an ethylene group or a propylene group.

m and n each represent an integer of 1 to 100, and is preferably an integer of 1 to 30 and more preferably an integer of 2 to 20. When m is 2 or more, plural $R^3$s may be the same as or different from each other. Similarly, when n is 2 or more, plural $R^5$s may be the same as or different from each other.

$R^2$ and $R^4$ each represent a linear or branched alkyl group having 1 to 20 carbon atoms, and specific examples thereof include a methyl group, an ethyl group, a propyl group, a butyl group, a hexyl group, and a dodecyl group. Each of $R^2$ and $R^4$ is preferably a methyl group, an ethyl group, an iso-propyl group, a n-propyl group, a n-butyl group, an iso-butyl group, or a tert-butyl group.

p and q each represent an integer of 0 to 2. $Y^1$ and $Y^2$ each represent a single bond or an alkylene group having 1 to 10 carbon atoms, and is preferably a single bond, a methylene group, or an ethylene group and more preferably a single bond.

$(Z^1)_{r+}$ and $(Z^2)^{s+}$ each represent an alkali metal ion, an alkaline earth metal ion, or an unsubstituted or alkyl group-substituted ammonium ion, and specific examples thereof include a lithium, a sodium ion, a potassium ion, a magnesium ion, a calcium ion, an ammonium ion, and a secondary, tertiary or quaternary ammonium ion substituted with an alkyl group having 1 to 20 carbon atoms, an aryl group having 1 to 20 carbon atoms, or an aralkyl group having 1 to 20 carbon atoms. Each of $(Z^1)^{r+}$ and $(Z^2)^{s+}$ is preferably a sodium ion. r and s each are an integer of 1 or 2.

Hereinafter, specific examples thereof are shown, but the invention is not limited by these examples.

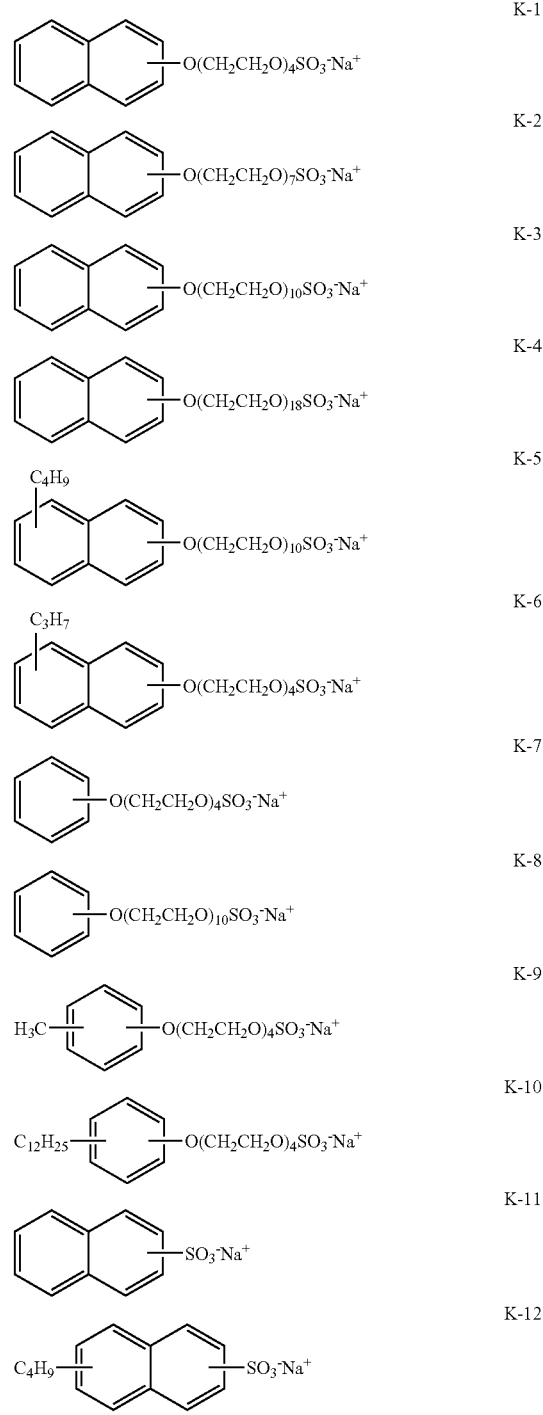

These aromatic anionic surfactants may be used singly or two or more of them. The amount of the aromatic anionic surfactant added, i.e., the concentration of the aromatic anionic surfactant in the developing solution, is preferably in the range of 1.0 to 10% by mass and more preferably in the range of 2 to 10% by mass. A content of less than 1.0% by mass leads to deterioration in printing efficiency and a decrease in solubility of photosensitive layer components, while a content of more than 10% by mass least to a decrease in printing durability of the printing plate.

The developing solution used in the invention may also contain other surfactant in addition to the aromatic anionic surfactant. Examples of other surfactant include nonionic surfactants including polyoxyethylene alkyl ethers such as polyoxyethylene naphthyl ether, polyoxyethylene alkyl phenyl ester, polyoxyethylene lauryl ether, polyoxyethylene cetyl ether, and polyoxyethylene stearyl ether, polyoxyethylene alkyl esters such as polyoxyethylene stearate, sorbitan alkyl esters such as sorbitan monolaurate, sorbitan monostearate, sorbitan distearate, sorbitan monooleate, sorbitan sesquioleate, and sorbitan trioleate, and monoglyceride alkyl esters such as glycerol monostearate, and glycerol monooleate. The content of other surfactant in the developing solution is preferably 0.1 to 10% by mass in terms of effective component conversion.

Chelating Agent for Chelating Bivalent Metal

The developing solution used in the invention preferably contains a chelating agent for chelating bivalent metal(s) in view of, for example, suppressing the adverse effects of calcium ions contained in hard water. Examples of the chelating agent for bivalent metal(s) include polyphosphates such as $Na_2P_2O_7$, $Na_5P_3O_3$, $Na_3P_3O_9$, $Na_2O_4P(NaO_3P)PO_3Na_2$, and Calgon (sodium polymetaphosphate); amino-polycarboxylic acids such as ethylenediamine tetraacetic acid and potassium, sodium, and amine salts thereof, diethylenetriamine pentaacetic acid and potassium and sodium salts thereof, triethylenetetramine hexaacetic acid and potassium and sodium salts thereof, hydroxyethylethylenediamine triacetic acid and potassium and sodium salts thereof, nitrilotriacetic acid and potassium and sodium salts thereof, 1,2-diaminocyclohexane tetraacetic acid and potassium and sodium salts thereof, and 1,3-diamino-2-propanol tetraacetic acid and potassium and sodium salts thereof; organic phosphonic acids such as 2-phosphonobutane tricarboxylic acid-1,2,4 and potassium and sodium salts thereof, 2-phosphonobutanone tricarboxylic acid-2,3,4 and potassium and sodium salts thereof, 1-phosphonoethane tricarboxylic acid-1,2,2 and potassium and sodium salts thereof, 1-hydroxyethane-1,1-diphosphonic acid and potassium and sodium salts thereof, and aminotri (methylenephosphonic acid) and potassium and sodium salts thereof. The chelating agent for bivalent metal(s) is preferably ethylenediamine tetraacetic acid or a potassium, sodium, or amine salt thereof, ethylenediamine tetra(methylenephosphonic acid) or a ammonium or potassium salt thereof, or hexamethylenediamine tetra(methylenephosphonic acid) or a ammonium or potassium salt thereof.

The optimum content of the chelating agent used depends on the hardness and the amount of hard water used. However, the content in the developing solution is generally in the range of 0.01 to 5% by mass and preferably 0.01 to 0.5% by mass.

The developing solution used in the invention may contain an alkali metal salt of an organic acid and/or an alkali metal salt of an inorganic acid as a development control agent. For example, one salt or two or more of salts selected from the group consisting of sodium carbonate, potassium carbonate, ammonium carbonate, sodium citrate, potassium citrate, and ammonium citrate may be contained in the developing solution.

Alkali Agent

Examples of the alkali agent contained in the developing solution used in the invention include inorganic alkali agents such as trisodium phosphate, tripotassium phosphate, triammonium phosphate, sodium borate, potassium borate, ammonium borate, sodium hydroxide, potassium hydroxide, ammonium hydroxide, and lithium hydroxide; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. In the invention, these alkali agents may be used singly or two or more of them can be used in combination.

In addition to the above compounds, the alkali agent can be alkali silicate. The alkali silicate may be used in combination with a base. The alkali silicate salt used is a salt that becomes alkaline when dissolved in water, and examples thereof include sodium silicate, potassium silicate, lithium silicate, and ammonium silicate. One of these alkali silicates may be used singly or in combination of two or more of them.

The developing solution for use in the invention can be optimally adjusted by controlling the mixing ratio and the concentrations of silicon oxide $SiO_2$, a component of the silicate used as a hydrophilizing component for a support, and an alkali oxide $M_2O$ (M represents an alkali metal or an ammonium group) used as an alkali component. The mixing ratio (molar ratio) of silicon oxide $SiO_2$ to alkali oxide $M_2O$ ($SiO_2/M_2O$) is preferably in the range of 0.75 to 4.0, and more preferably in the range of 0.75 to 3.5 for the purpose of suppressing stains caused by leaving a support in the developing solution for a long period of time caused by excessively dissolving (etching) an anodic oxide film on the support in the solution, or suppressing the generation of insoluble gas caused by the dissolved aluminum and silicate forming a complex.

From the viewpoints of suppression of dissolution (etching) of the anodic oxide film disposed on the support, a developing property, suppression of precipitation and crystal growth, and suppression of gelling of the alkaline silicate caused by neutralization of wastewater, the concentration of the alkali silicate in the developing solution is such that the content of silicon dioxide in the developing solution is preferably in the range of 0.01 to 1 mol/L and more preferably in a range of 0.05 to 0.8 mol/L.

The developing solution used in the invention may further contain the following components in addition to the components described above, if necessary. Examples thereof include organic carboxylic acids such as benzoic acid, phthalic acid, p-ethylbenzoic acid, p-n-propylbenzoic acid, p-iso-propylbenzoic acid, p-n-butylbenzoic acid, p-t-butylbenzoic acid, p-2-hydroxyethylbenzoic acid, decanoic acid, salicyclic acid, and 3-hydroxy-2-naphthoic acid; organic solvents such as propylene glycol; and reducing agents, dyes, pigments, water softeners, and antiseptics.

The pH of the developing solution for use in the invention is preferably in the range of 10 to 12.5 and more preferably in the range of 11 to 12.5 at 25° C. Even when the developing solution used in the invention has such a low pH, the developing solution contains the surfactant described above, and therefore exhibits an excellent developing property with respect to the non-image portion of a plate. Adjusting the pH of the developing solution to a relatively low value can lessen damage on image portions during development and facilitate handling of the developing solution.

The electric conductivity x of the developing solution is preferably larger than 2 mS/cm and smaller than 30 mS/cm, and is more preferably in a range of 5 to 25 mS/cm.

It is preferable to add an alkali metal salt of an organic or inorganic acid to the developing solution as an agent for adjusting the electric conductivity of the developing solution.

The developing solution described above may be used as a developing solution and a developing replenisher, and is preferably used in automatic developing machines. In a case of an automatic developing machine, the developing solution becomes fatigued, as the amount of processed plates increases. Therefore, developing ability of the machine may be recovered by supplying a replenisher or new developing solution thereto. The replenishing method is preferably applied to the plate-making method according to the invention.

In addition, replenishing by the method described in U.S. Pat. No. 4,882,246 is preferable for recovering the developing ability of the automatic developing machine. In addition, the developing solutions described in JP-A Nos. 50-26601 and 58-54341 and JP-B Nos. 56-39464, 56-42860, and 57-7427 are also preferably used in the invention.

The planographic printing plate developed in this manner is post-treated with washing water, a rinsing solution containing a surfactant, and a desensitizing solution containing gum arabic, and/or a starch derivative, as described in JP-A Nos. 54-8002, 55-115045, and 59-58431. Various combinations of these treatments may be used as the post-treatment of the photosensitive layer of the planographic printing plate used in the invention. The planographic printing plate after these treatments is set in an offset printing machine, and used for printing on a number of sheets of paper.

In the method of making a planographic printing plate according to the invention, the entire surface of the developed images may be heated or irradiated for the purpose of improving image strength and printing durability.

Highly severe conditions may be used in the heating after development. The planographic printing plate can be generally heated at a heating temperature in the range of 200 to 500° C. A lower heating temperature after development does not allow sufficient strengthening of the image, while a higher heating temperature may result in deterioration of the support and thermal decomposition of the image portions.

The planographic printing plate prepared in this manner is set in an offset printing machine and used for printing on a number of sheets of paper.

A plate cleaner used to remove stains on the plates during printing is a conventionally known plate cleaner for PS plates, and examples thereof include CL-1, CL-2, CP, CN-4, CN, CG-1, PC-1, SR, and IC (all trade names, manufactured by Fuji Photo Film Co. Ltd.).

EXAMPLES

Hereinafter, the invention will be described with reference to examples, but it should be understood that the invention is not restricted thereto.

Example 1

Preparation of Support

An aluminum plate consisting of 99.5% by mass or more of aluminum and having a thickness of 0.30 mm and a width of 1,030 mm was subjected to the following surface treatment.

Surface Treatment

The surface treatment was carried out by sequentially conducting the following steps (a) to (f). After each step and water washing, liquid remaining on the aluminum plate was removed with a nip roller.

(a) The aluminium plate was etched in a solution containing 26 mass % of sodium hydroxide and 6.5 mass % of aluminium ions at 70° C., until the amount of dissolved aluminum became 5 g/m$^2$. The etched plate was then washed with water.

(b) The aluminum plate was desmutted by spraying an aqueous solution including 1 mass % of nitric acid and 0.5 mass % of aluminium ions and kept at 30° C. on the plate. The aluminum plate was then washed with water.

(c) The surface of the aluminum plate was continuously electrochemically roughened by applying an alternate current voltage having a frequency of 60 Hz to the plate immersed in an electrolyte which was an aqueous solution including 1 mass % of nitric acid, 0.5 mass % of aluminium ions and 0.007 mass % of ammonium ions and kept at 30° C. The alternate current voltage had a trapezoidal waveform, a time which it took to increase an electric current value from zero to peak (TP) was 2 mseconds, and a duty ratio was 1:1. In the treatment, a carbon electrode was used as a counter electrode. A ferrite electrode was used as an auxiliary anode. The electric current density was 25 A/dm$^2$ at the peak of electric current. The total amount of electricity used in this treatment and used when the aluminium plate served as an anode was 250 C/cm$^2$. A part (5%) of the current supplied from a power source was applied to the auxiliary anode. The aluminum plate was then washed with water.

(d) The aluminium plate was etched by spraying a solution containing 26 mass % of sodium hydroxide and 6.5 mass % of aluminium ions on the plate at 35° C., until the amount of dissolved aluminum became 0.2 g/m$^2$. Thereby, smuts mainly including aluminum hydroxide which had occurred during the electrochemical surface roughening by using the alternate current were removed, and the edge portions of pits generated were dissolved and smoothened. The aluminum plate was then washed with water.

(e) The aluminum plate was desmutted by spraying an aqueous solution including 25 mass % of sulfuric acid and 0.5 mass % of aluminium ions and kept at 60° C. to the plate. Water was sprayed on the plate to wash the plate.

(f) The aluminum plate was anodized in an electrolyte containing sulfuric acid at a concentration 170 g/L and additionally containing aluminium ions at a concentration 0.5 mass % and kept at 33° C. at an electric current density of 5 A/dm$^2$ for 50 seconds. The aluminum plate was then washed with water. After the treatment, the amount of anodic oxide film was 2.7 g/m$^2$.

The surface roughness Ra of the aluminum support thus obtained was measured with an apparatus (trade name: SURFCOM, manufactured by Tokyo Seimitsu Co. Ltd.: having a stylus with a distal diameter of 2 μm) to found to be 0.27.

| Undercoat layer | 3 g |

Subsequently, the following coating solution for an undercoat layer was applied onto the aluminum support with a wire bar and the resultant coating was dried at 90° C. for 30 seconds. The coating amount was 10 mg/m$^2$.

| Composition of Coating solution for undercoat layer | |
|---|---|
| Polymer compound A having the following structure | 0.05 g |
| Methanol | 27 g |
| Deionized water | 3 g |
| Polymer compound A | |

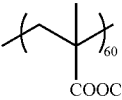

Photosensitive Layer

Subsequently, the following photosensitive layer coating solution [P-1] was prepared and applied onto the undercoat layer with a wire bar. The coated support was dried with a hot-air dryer at 115° C. for 34 seconds. The dry coating amount was 1.3 g/m².

| Composition of Photosensitive layer coating solution [P-1] | |
|---|---|
| Infrared absorbing agent (IR-1) | 0.074 g |
| Polymerization initiator (OS-12) | 0.280 g |
| Additive (PM-1) | 0.151 g |
| Polymerizable compound (AM-1) | 1.00 g |
| Specific binder polymer (BT-1) | 1.00 g |
| Ethyl violet (C-1) | 0.04 g |
| Fluorine surfactant (trade name: MEGAFAC F-780-F manufactured by Dainippon Ink and Chemicals, Inc. in the form of a 30 mass % methyl isobutyl ketone (MIBK) solution) | 0.015 g |
| Methyl ethyl ketone | 10.4 g |
| Methanol | 4.83 g |
| 1-Methoxy-2-propanol | 10.4 g |

The polymerization initiator (OS-12) used in the photosensitive layer coating solution is one of the aforementioned onium salt compounds represented by Formula (1). The structures of the infrared absorbing agent (IR-1), additive (PM-1), polymerizable compound (AM-1), binder polymer (BT-1), and ethyl violet (C-1) are shown below.

(IR-1)

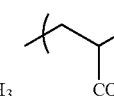

(PM-1)

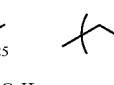

(AM-1)

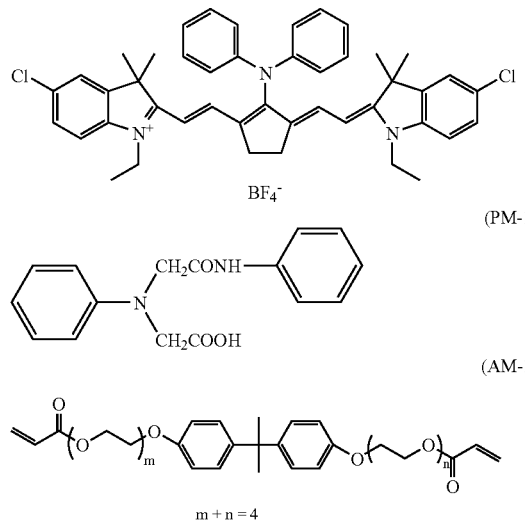

m + n = 4

(BT-1)

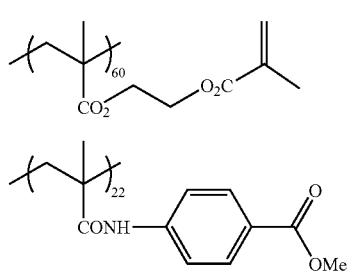

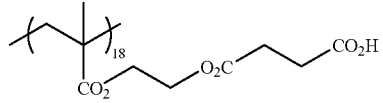

(C-1)

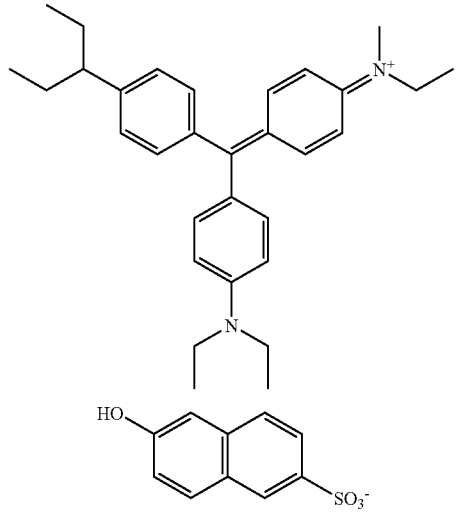

Protective Layer (1) Preparation of the Inorganic Lamellar Compound (Mica)

A mica dispersion liquid is obtained by adding 6.4 g of synthetic mica (trade name: Somasif ME-100; manufactured by Co-op Chemical Company; aspect ratio over 1000) to 193.6 g of water, then dispersed using a homogenizer until the average particle size is equivalent to a circle of diameter 3 μm (laser scattering method).

(2) Coating of Coating Solution for Protective Layer

An aqueous mixture solution (coating solution for protective layer) containing the mica dispersion liquid thus obtained and polyvinyl alcohol (degree of saponification of 98 mol %, degree of polymerization of 500), a copolymer of polyvinylpyrrolidone and vinylacetate (trade name: LUVITEC VA64W, manufacture by ICP, molar ratio of polyvinylpyrrolidone/vinylacetate=6/4), and a surfactant (trade name: EMALEX 710, manufactured by NIppon Emulsion Co., Ltd.) was applied onto the photosensitive layer with a wire bar and the coating was dried with a hot-air dryer at 125° C. for 75 seconds.

The ratio of solid content of mica/polyvinyl alcohol/copolymer of polyvinylpyrrolidone and vinylacetate was 16/80/2/2 (by mass %), and the dry coating amount was 1.15 g/m².

A planographic printing plate precursor of Example 1 was thus prepared.

Examples 2 to 11

Planographic printing plate precursors of Examples 2 to 11 were prepared in the same manner as described in Example 1, except that the type and included amount of the inorganic lamellar compound, the type of the binder component, and the total coating amount were changed as described in the following Table 1. When the content ratio of the lamellar compound was changed, the content ratio of the copolymer of polyvinylpyrrolidone and vinylacetate was changed so as to balance the change of the content ratio of the lamellar compound.

Comparative Example 1

Planographic printing plate precursor of Comparative Example 1 was prepared in the same manner as described in Example 1, except that the content ratio of the polyvinylalcohol/the copolymer of polyvinylpyrrolidone and vinylacetate/the surfactant was changed so as to be 78/20/2 by mass %, and the total coating amount (coating amount weighted after being dried) was changed to 2.00 g/m².

Comparative Example 2

Planographic printing plate precursor of Comparative Example 2 was prepared in the same manner as described in Example 1, except that the specific binder polymer (BT-1) was changed to the specific binder polymer (BT-2) shown below.

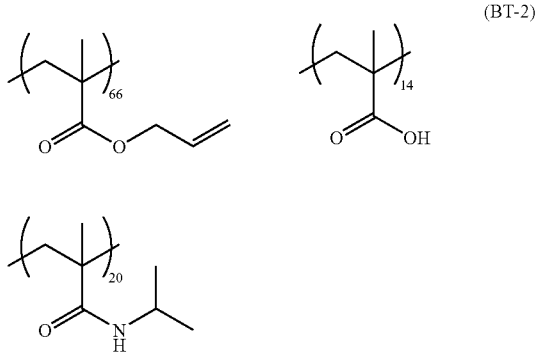

(BT-2)

Evaluation (1) Evaluation of Sensitivity

The planographic printing plate precursor obtained was exposed to light at a resolution of 2400 dpi at an external surface drum revolution of 150 rpm by using an exposure apparatus (trade name: TREND SETTER 3244, manufactured by Creo Co., Ltd.) while output was stepwise changed in the range of 0 to 8 W and log E was changed at an interval of 0.15. The exposure was carried out at 25° C. at 50% RH. The exposed planographic printing plate was developed with an automatic developing machine (trade name: LP-1310HII, manufactured by Fuji Photo Film Co., Ltd.) at a conveying speed (line speed) of 2 m/minute and a developing temperature of 30° C. A solution containing DH-4 (trade name, manufactured by Fuji Photo Film Co., Ltd.) diluted with water at a ratio of 1:4 was used as a developing solution, and a solution containing GN-2K (trade name, manufactured by Fuji Photo Film Co., Ltd.) diluted with water at a ratio of 1:1 was used as a finisher solution.

The density of the image portions of the developed planographic printing plate, the cyan density, was measured with a reflection densitometer (trade name: RD-918, manufactured by Macbeth) and the red filter attached to the densitometer. The inverse of light exposure necessary to obtain a measured density of 0.8 was used as an indicator of sensitivity. Evaluation results of the planographic printing plates are represented by relative values, given the sensitivity of the planographic printing plate of Example 1 was regarded as 100. The larger the value is, the higher the sensitivity is. Results are summarized in Table 1.

(2) Evaluation of Image Quality

The planographic printing plate precursor obtained was exposed to light with TREND SETTER 3244 (described above) at a resolution of 2,400 dpi at an output of 7 W at an external surface drum revolution of 150 rpm at a plate-surface energy of 110 mJ/cm². At this time, an 80% screen tint image was used. The exposed plate was developed in the same manner as the development in the sensitivity evaluation. The degree of screen-tint unevenness on the developed planographic printing plate was visually checked. The results were classified into levels 1 to 5, and level 3 represents the practically allowable lower limit and levels 2 and 1 are not at practical level.

(3) Evaluation of Printing Properties

The planographic printing plate used in the evaluation of image quality (2) was set in a printing machine (trade name: LITHRONE, manufactured by Komori Corp.) and printing was conducted. The degree of stain in the non-image portions and printing durability were evaluated. The degree of stain in the non-image portions was sensorily classified into levels 1 to 5, and level 3 is the practically lower-limit allowable level and levels 2 and 1 are not at practical level.

(4) Evaluation of Adhesion Resistance

Three of the obtained planographic printing plate precursors (10×10 cm) are moisture conditioned under conditions of 25° C. and 75% RH for 2 hours. Then a stack is obtained by superimposing the 3 precursors facing the same direction without the interleaving of interleaving papers.

This stack is closely wrapped in A1 kraft paper, a 4 kg weight is placed on and then left in conditions of 30° C. for 5 hours. Then an evaluation is made in the stack of the adhesion state of the planographic printing plate precursor photosensitive layer side surface (protecting layer surface) to the adjacent planographic printing plate precursor support body surface. For the adhesion resistance a scale of 1 to 5 was used, 3 being the lowest useable level, and 2 and below being unusable levels.

(5) Evaluation of Feedability

A stack was made of planographic printing plate precursors (110×40 cm) in the state without interleaving interleaving papers, and these were set in an Amizisetter manufactured by NEC Corporation, normally fed, and it was checked as to whether they could be exposed or not. In the test 20 sheets were continuously processed, and the number of these plates which generated errors used to calculate the error ratio. The feedability was evaluated according to this ratio.

The results of this evaluation are shown in Table 1.

TABLE 1

| | Protecting layer | | | | Evaluation results | | | | | |
|---|---|---|---|---|---|---|---|---|---|---|
| | Inorganic lamellar compound | | Binder Component | Total coating amount (g/m$^2$) | Sensitivity | Printability | | | Adhesion resistance | Feedability (error %) |
| | Type | Amount included (mass %) | | | | Image quality | Non-print area smudging | Print durability (1000 sheets) | | |
| Example 1 | Somasif ME-100 | 3 | PVA-105 | 1.15 | 150 | 5 | 5 | 140 | 3 | 0 |
| Example 2 | Somasif ME-100 | 16 | PVA-105 | 0.50 | 150 | 4 | 5 | 120 | 4 | 0 |
| Example 3 | Somasif ME-100 | 16 | PVA-105 | 1.15 | 165 | 5 | 5 | 150 | 4 | 0 |
| Example 4 | Somasif ME-100 | 10 | PVA-105 | 1.15 | 160 | 5 | 5 | 140 | 4 | 0 |
| Example 5 | Somasif ME-100 | 25 | PVA-105 | 1.15 | 165 | 5 | 5 | 150 | 5 | 0 |
| Example 6 | Micromica MK-100*[1] | 10 | PVA-105 | 1.50 | 165 | 5 | 5 | 150 | 4 | 0 |
| Example 7 | Micromica MK-100*[1] | 20 | PVA-105 | 1.50 | 165 | 5 | 5 | 150 | 5 | 0 |
| Example 8 | Micromica MK-100*[1] | 40 | PVA-105 | 1.50 | 165 | 5 | 5 | 150 | 5 | 0 |
| Example 9 | Somasif MK-100 | 20 | KL-506*[2] | 0.75 | 160 | 5 | 5 | 140 | 5 | 0 |
| Example 10 | Somasif ME-100 | 20 | KL-506*[2] | 1.25 | 165 | 5 | 5 | 150 | 5 | 0 |
| Example 11 | Somasif ME-l00 | 20 | KL-506*[2] | 1.75 | 165 | 5 | 5 | 150 | 5 | 0 |
| Comparative Example 1 | None | NA | PVA-105 | 2.00 | 165 | 5 | 5 | 150 | 1 | 10 |
| Comparative Example 2 | Somasif ME-100 | 16 | PVA-105 | 1.15 | 100 | 3 | 5 | 40 | 4 | 0 |

*[1]Manufactured by Co-op Chemical Company, aspect ratio: 20 to 30
*[2]Manufactured by Kuraray Company Ltd., saponicication degree 77 mol %, polymerization degree: 600

It can be seen from Table 1, that planographic printing plate precursors of Examples 1 to 11, that is the planographic printing plate precursors on which a protecting layer including the inorganic lamellar compound has been provided on a polymerizable negative photosensitive layer containing the prescribed binder polymer, when compared to the planographic printing plate precursors of the two Comparative Examples, that they have high sensitivity/high image quality, and have good printing areas. Also, even after keeping in conditions of high humidity, no adhesion between the planographic printing plate precursors is observed, and there are no problems with normal feeding in a CTP setter without using interleaving papers.

In response to this, the planographic printing plate precursor of Comparative Example 1, in which the protecting layer does not include the inorganic lamellar compound, after keeping in conditions of high humidity exhibits adhesion between planographic printing plate precursors. The adhesion resistance is remarkably worsened, and it is shown that there are problems with feeding in a CTP setter without using interleaving papers.

Further more, it is shown that the Comparative Example 2, where a protecting layer including the inorganic lamellar compound has been provided on a polymerizable negative photosensitive layer which does not contain the prescribed binder polymer, when printing there is smudging in the non-printing areas, and whilst the adhesion resistance and feeding in a CTP setter without using interleaving sheets is good, when compared with the planographic printing plate precursors of Examples 1 to 11, the sensitivity, image quality, and print durability are inferior.

What is claimed is:

1. A planographic printing plate precursor comprising a support, and a photosensitive layer and a protective layer, which are formed in this sequence on or above the support, wherein:
the photosensitive layer comprises an infrared absorbing agent, a polymerization initiating agent, a polymerizable compound and a binder polymer comprising repeating units as represented by the following Formula (i); and the protective layer comprises an inorganic lamellar compound:

Formula (i)

wherein, $R^1$ represents a hydrogen atom or a methyl group; $R^2$ represents a connecting group having a chain structure and having two or more types of atom selected from the group consisting of a carbon atom, a hydrogen atom, an oxygen atom, a nitrogen atom, and a sulfur atom, and having 2 to 82 atoms in total; A represents an oxygen atom or —$NR^3$—, and $R^3$ represents a hydrogen atom or a monovalent hydrocarbon group having 1 to 10 carbon atoms; and n is an integer of 1 to 5.

2. A planographic printing plate precursor according to claim 1, wherein a coating amount of the protective layer when dry is 0.5 to 2.0 g/m$^2$.

3. A planographic printing plate precursor according to claim 1, wherein an amount of the inorganic lamellar compound contained in the protecting layer is in a range of 5 to 55% by mass relative to a total solid content of the protecting layer.

4. A planographic printing plate precursor according to claim 1, wherein the inorganic lamellar compound is mica.

5. A planographic printing plate precursor according to claim 1, wherein the inorganic lamellar compound is swelling synthetic mica.

6. A planographic printing plate precursor according to claim 1, wherein the inorganic lamellar compound is fluorine-containing swelling synthetic mica.

7. A planographic printing plate precursor according to claim 1, wherein the inorganic lamellar compound is in a form of particles having an aspect ratio of 20 or more, an average major axis of 0.3 to 20 μm, and an average thickness of 0.1 μm or less.

8. A planographic printing plate precursor according to claim 1, wherein the protective layer comprises polyvinyl alcohol as a binder component.

9. A planographic printing plate precursor according to claim 1, wherein the protective layer comprises polyvinyl alcohol and polyvinyl pyrrolidone as binder components.

10. A planographic printing plate precursor according to claim 9, wherein an addition ratio by mass of polyvinyl alcohol/polyvinyl pyrolidone is 3/1 or less.

11. A planographic printing plate precursor according to claim 1, wherein the connecting group represented by $R^2$ in Formula (i) is a hydrocarbon group having an alicyclic structure having 3 to 30 carbon atoms and a valency of (n+1).

12. A method for forming the planographic printing plate precursor of claim 1, comprising:
preparing a dispersion liquid of the inorganic lamellar compound;
preparing a protecting layer coating liquid, by blending the dispersion on liquid and a binder component; and
coating the protecting layer coating liquid over the photosensitive layer so as to form the protecting layer.

13. A planographic printing plate precursor according to claim 1, wherein the binder polymer comprising repeating units as represented by the following Formula (i);

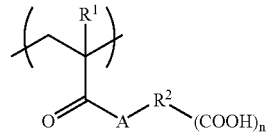

Formula (i)

wherein, $R^1$ represents a hydrogen atom or methyl group; $R^2$ represents a connecting group having a chain structure having an ester bond and having two or more types of atom selected from the group consisting of a carbon atom, a hydrogen atom, an oxygen atom, a nitrogen atom, and a sulfur atom, and having 2 to 82 atoms in total; A represents an oxygen atom or —$NR^3$—, and $R^3$ represents a hydrogen atom or a monovalent hydrocarbon group having 1 to 10 carbon atoms; and n is an integer of 1 to 5.

* * * * *